(12) United States Patent
Kong et al.

(10) Patent No.: US 12,464,880 B2
(45) Date of Patent: Nov. 4, 2025

(54) DISPLAY DEVICE

(71) Applicant: Samsung Display Co., Ltd., Yongin-si (KR)

(72) Inventors: Tae Jin Kong, Yongin-si (KR); Jun Seok Min, Yongin-si (KR); Jin Sun Kim, Yongin-si (KR); Soo Hyun Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 503 days.

(21) Appl. No.: 18/087,314

(22) Filed: Dec. 22, 2022

(65) Prior Publication Data
US 2023/0343916 A1    Oct. 26, 2023

(30) Foreign Application Priority Data

Apr. 22, 2022 (KR) ........................ 10-2022-0050341

(51) Int. Cl.
| | |
|---|---|
| *H05K 7/20* | (2006.01) |
| *H01L 25/16* | (2023.01) |
| *H05K 5/02* | (2006.01) |
| *H10H 20/858* | (2025.01) |

(52) U.S. Cl.
CPC ....... *H10H 20/8583* (2025.01); *H01L 25/167* (2013.01); *H05K 5/0217* (2013.01); *H05K 7/20336* (2013.01); *H05K 7/2099* (2013.01)

(58) Field of Classification Search
CPC .............................................. H10H 20/8583
See application file for complete search history.

(56) References Cited

U.S. PATENT DOCUMENTS

| | | | |
|---|---|---|---|
| 6,404,627 B1 | 6/2002 | Tanaka et al. | |
| 10,271,466 B1 | 4/2019 | Wu | |
| 10,747,269 B1 | 8/2020 | Choi et al. | |
| 10,750,625 B2 * | 8/2020 | Park | H05K 1/142 |
| 2007/0262318 A1 * | 11/2007 | Shoji | H10D 30/0321 |
| | | | 257/E29.147 |
| 2008/0291614 A1 | 11/2008 | Sakata et al. | |
| 2020/0204666 A1 * | 6/2020 | Hong | G06F 1/203 |
| 2020/0326134 A1 | 10/2020 | Chen et al. | |
| 2020/0356143 A1 | 11/2020 | Oh et al. | |

(Continued)

FOREIGN PATENT DOCUMENTS

| | | |
|---|---|---|
| CN | 110822960 A | 2/2020 |
| KR | 10-2299992 B1 | 9/2021 |

(Continued)

OTHER PUBLICATIONS

EPO Extended European Search Report dated Jan. 23, 2024, issued in corresponding European Patent Application No. 23164857.7 (18 pages).

*Primary Examiner* — Mukundbhai G Patel
(74) *Attorney, Agent, or Firm* — Womble Bond Dickinson (US) LLP

(57) ABSTRACT

A display device includes: a first base layer; a second base layer on the first base layer; a pixel circuit layer on the second base layer, the pixel circuit layer including a transistor; a display element layer on the pixel circuit layer, the display element layer including a light emitting element electrically connected to the transistor; a metal layer between the first base layer and the second base layer; and a heat pipe in contact with the metal layer.

19 Claims, 22 Drawing Sheets

(56) References Cited

U.S. PATENT DOCUMENTS

| | | |
|---|---|---|
| 2021/0051809 A1* | 2/2021 | Song .................... G09F 9/301 |
| 2021/0242380 A1 | 8/2021 | Kim et al. |
| 2021/0325929 A1 | 10/2021 | Cai et al. |
| 2022/0011814 A1 | 1/2022 | Ryou et al. |
| 2022/0083167 A1 | 3/2022 | Park |
| 2022/0166082 A1 | 5/2022 | Wang et al. |
| 2022/0269312 A1 | 8/2022 | Choi et al. |

FOREIGN PATENT DOCUMENTS

| | | |
|---|---|---|
| WO | WO 2019/009542 A1 | 1/2019 |
| WO | WO 2021/071024 A1 | 4/2021 |
| WO | WO 2021/238450 A1 | 12/2021 |
| WO | WO 2021/249316 A1 | 12/2021 |

\* cited by examiner

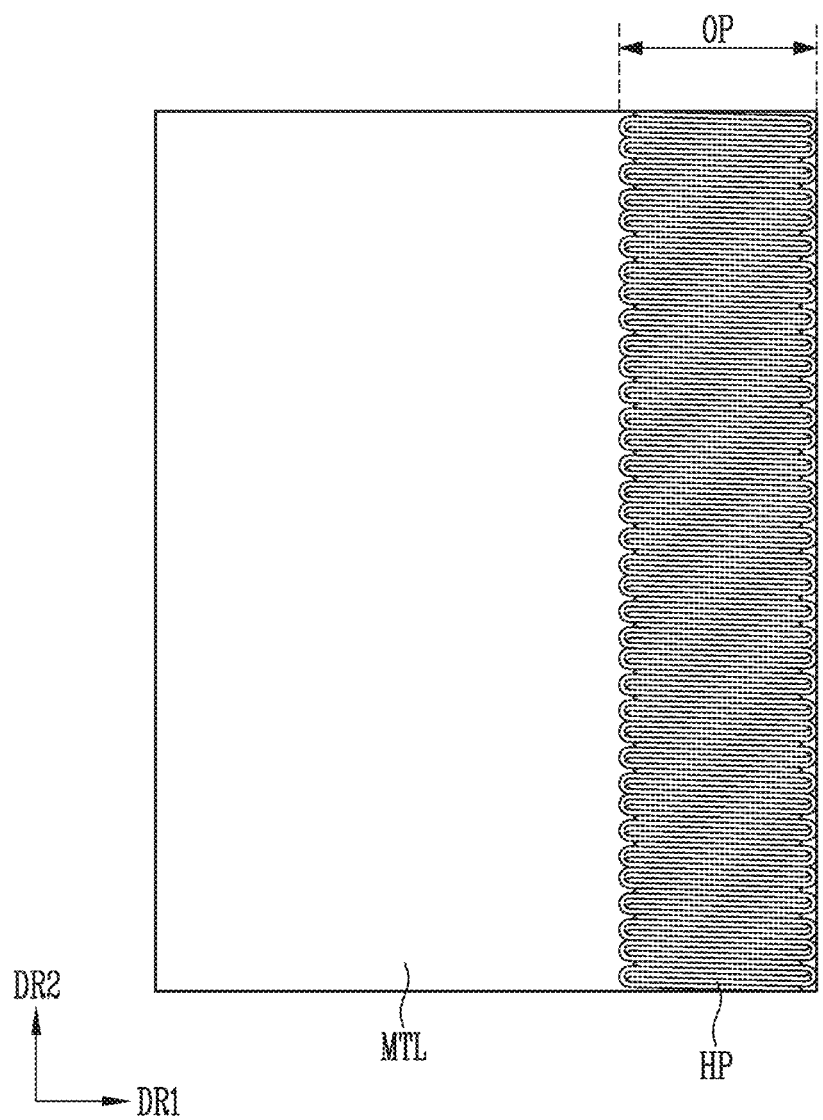

DAM: BNK, D_BNK
LCP: CCL, CF

DISPLAY DEVICE

CROSS-REFERENCE TO RELATED APPLICATION

This application claims priority to and the benefit of Korean patent application No. 10-2022-0050341, filed on Apr. 22, 2022, in the Korean Intellectual Property Office, the entire disclosure of which is incorporated by reference herein.

BACKGROUND

1. Field

Aspects of embodiments of the present disclosure relate to a display device.

2. Description of the Related Art

Recently, as interest in information displays has increased, research and development of display devices have been continuously conducted. A display device may include a display panel for generating an image. The display panel may generate heat while operating. Thus, the effective diffusing and/or releasing of the generated heat may be desired.

The above information disclosed in this Background section is for enhancement of understanding of the background of the present disclosure, and therefore, it may contain information that does not constitute prior art.

SUMMARY

One or more embodiments of the present disclosure are directed to a display device, in which the effective diffusing and/or releasing of heat generated in a display panel may be improved.

According to one or more embodiments of the present disclosure, a display device includes: a first base layer; a second base layer on the first base layer; a pixel circuit layer on the second base layer, the pixel circuit layer including a transistor; a display element layer on the pixel circuit layer, the display element layer including a light emitting element electrically connected to the transistor; a metal layer between the first base layer and the second base layer; and a heat pipe in contact with the metal layer.

In an embodiment, the metal layer may be electrically insulated from the transistor of the pixel circuit layer.

In an embodiment, the metal layer may not overlap with the light emitting element in a plan view.

In an embodiment, an opening exposing the metal layer may penetrate the first base layer, and the heat pipe may be located in the opening.

In an embodiment, at least a portion of each of the first base layer and the second base layer may be configured to be rollable at one side thereof.

In an embodiment, the heat pipe may be located at one area of the second base layer adjacent to another side of the first base layer opposite to the one side of the first base layer, and may be configured to not be rollable.

In an embodiment, the display device may further include a lower film under the first base layer, and the heat pipe may not overlap with the lower film in a plan view.

In an embodiment, the lower film may include a first cushion layer, a support layer, and a second cushion layer, which are sequentially stacked, and the support layer may include a support member having an area of an upper surface facing the first cushion layer and an area of a lower surface facing the second cushion layer that are different from each other.

In an embodiment, the support member may include a plurality of support patterns spaced from each other along a rolling direction of the first base layer.

In an embodiment, the light emitting element may include an inorganic light emitting diode.

In an embodiment, the display element layer may further include a light conversion pattern over the light emitting element, the light conversion pattern being configured to convert a wavelength of light emitted from the light emitting element.

According to one or more embodiments of the present disclosure, a display device includes: a metal layer; a first base layer on the metal layer; a second base layer on the first base layer; a pixel circuit layer on the second base layer, the pixel circuit layer including a transistor; a display element layer on the pixel circuit layer, the display element layer including a light emitting element electrically connected to the transistor; and a heat pipe in contact with the metal layer.

In an embodiment, the metal layer may not overlap with the light emitting element in a plan view.

In an embodiment, at least a portion of each of the first base layer and the second base layer may be configured to be rollable at one side thereof, and the heat pipe may be located at one area of the second base layer that is adjacent to another side of the first base layer opposite to the one side of the first base layer, and may be configured to not be rollable.

According to one or more embodiments of the present disclosure, a display device includes: a display panel including a plurality of pixels; a housing configured to accommodate the display panel therein, the housing having a slot at one side surface thereof; a rotating member located inside the housing, the rotating member configured to roll and unroll the display panel; a holding member configured to hold the rotating member; and a heat pipe located at a partial area of the display panel that is adjacent to the slot of the housing when the display panel is in a rolled state.

In an embodiment, the partial area of the display panel where the heat pipe is located may be configured to not be rollable.

In an embodiment, the display device may further include a lower film under the display panel, and the heat pipe may not overlap with the lower film in a plan view.

In an embodiment, the display panel may include: a first base layer; a second base layer on the first base layer; a pixel circuit layer on the second base layer, the pixel circuit layer including a transistor; a display element layer on the pixel circuit layer, the display element layer including a light emitting element electrically connected to the transistor; and a metal layer between the first base layer and the second base layer. The heat pipe may be in contact with the metal layer.

In an embodiment, an opening exposing the metal layer may penetrate the first base layer, and the heat pipe may be located in the opening.

In an embodiment, the display panel may include: a metal layer; a first base layer on the metal layer; a second base layer on the first base layer; a pixel circuit layer on the second base layer, the pixel circuit layer including a transistor; and a display element layer on the pixel circuit layer, the display element layer including a light emitting element electrically connected to the transistor. The heat pipe may be in contact with the metal layer.

BRIEF DESCRIPTION OF THE DRAWINGS

The above and other aspects and features of the present disclosure will be more clearly understood from the following detailed description of the illustrative, non-limiting embodiments with reference to the accompanying drawings.

FIG. 9 is a plan view illustrating an embodiment of a heat pipe included in the display panel shown in FIGS. 8A and 8B.

DETAILED DESCRIPTION

Figure 1:
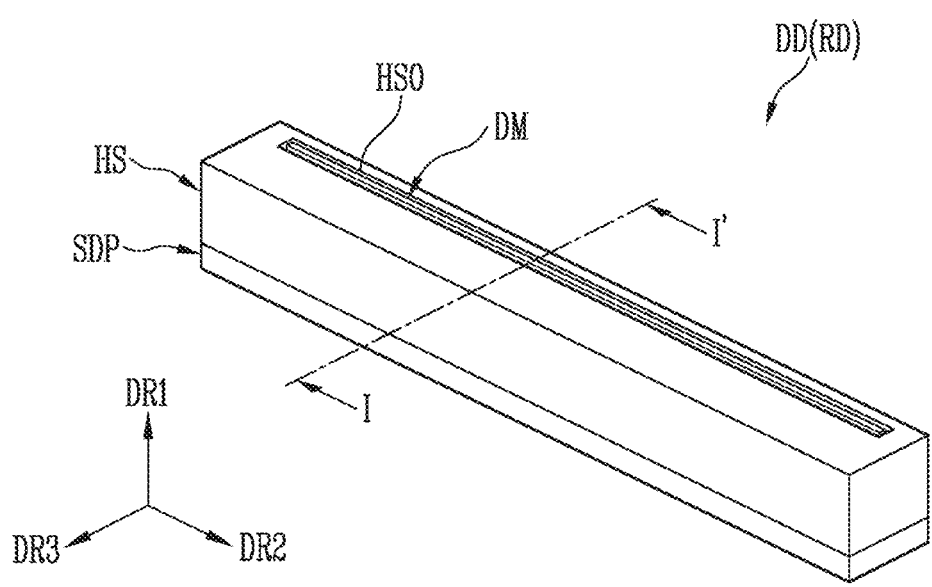
FIG. 1 is a perspective view schematically illustrating a display device in accordance with an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, ratios, and dimensions of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, as used in the present specification, the terms "connection" and "coupling" may inclusively mean connection or physical and/or electrical coupling. Further, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
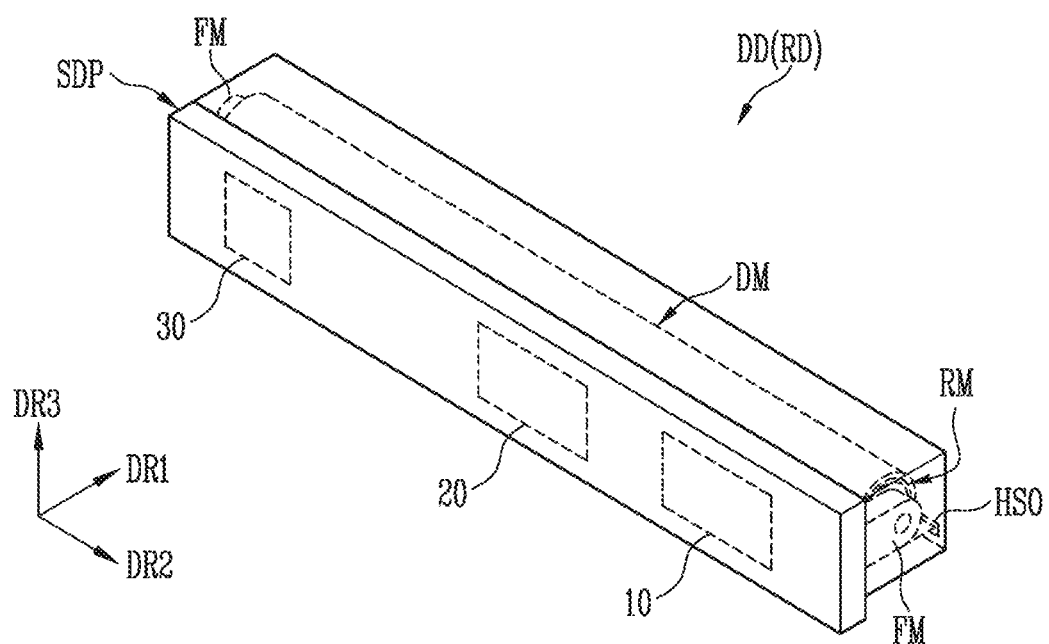
FIG. 2 is a side perspective view schematically illustrating the display device shown in FIG. 1.
Figure 3:
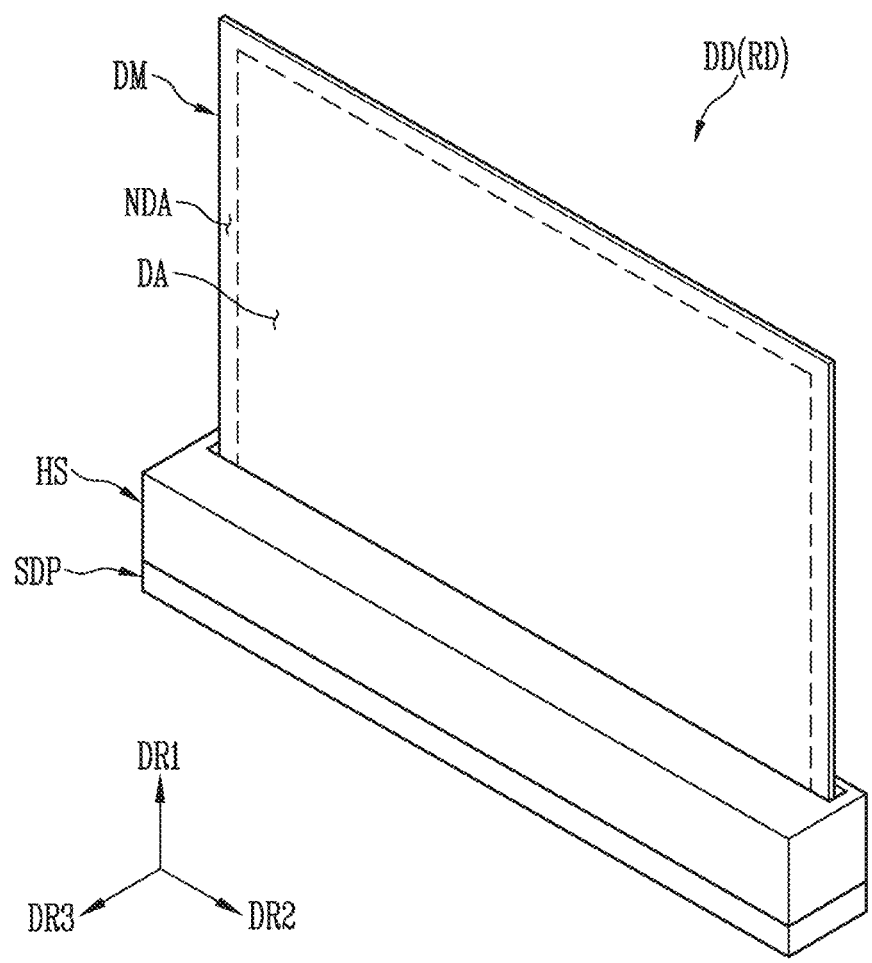
FIG. 3 is a perspective view illustrating a state in which a display module is unrolled in the display device shown in FIG. 1.

FIG. 1 is a perspective view schematically illustrating a display device in accordance with an embodiment of the present disclosure. FIG. 2 is a side perspective view schematically illustrating the display device shown in FIG. 1. FIG. 3 is a perspective view illustrating a state in which a display module (e.g., a display screen or a display panel) is unrolled in the display device shown in FIG. 1.

Referring to FIGS. 1 to 3, the display device DD in accordance with an embodiment of the present disclosure may be a rollable display device RD.

The display device DD may include a housing HS and a mounting part SDP. The display device DD may further include a display module DM (e.g., a display screen or display panel), a rotating member RM, and a holding member FM, which are provided inside the housing HS.

The housing HS is an instrument that accommodates the display module DM that is rolled with a suitable curvature (e.g., a predetermined curvature) therein. The display module DM may be a rollable display module.

A slot HSO (e.g., a housing opening) through which the display module DM may pass may be provided at one side surface of the housing HS. The slot HSO of the housing HS may be a path for rolling and unrolling (e.g., unwinding) of the display module DM. In an example, the display module DM may be rolled inside the housing HS through the slot HSO of the housing HS, and/or be unrolled to the outside of the housing HS (e.g., in a first direction DR1). The shape of the slot HSO of the housing may correspond to a sectional shape of the display module DM, but the present disclosure is not limited thereto.

The rotating member RM (e.g., a roller) may be accommodated in the housing HS to roll and/or unroll the display module DM. The rotating member RM may be rotatably installed inside the housing HS. The rotating member RM may be fixed in the housing HS by the holding member FM. The rotating member RM may have a cylindrical shape extending in a second direction DR2, but the present disclosure is not limited thereto. For example, the rotating member RM may have a polygonal sectional shape. The display module DM may be rolled on an outer circumferential surface of the rotating member RM.

The holding member FM may fix or support the rotating member RM inside the housing HS. For example, the holding member FM may be disposed at opposite end portions of the rotating member RM, and a rotating shaft of the rotating member RM may be rotatably coupled to (e.g., connected to or attached to) the holding member FM. Also, the holding member FM may rotate the rotating member RM. In an example, the holding member FM may include a motor disposed at at least one side of the rotating member RM, to rotate the rotating shaft of the rotating member RM. The motor may include, for example, a stepping motor, a thermomotor, and/or the like.

The mounting part SDP may be provided at one side of the housing HS. The mounting part SDP may be provided with a controller 30 for outputting an image to the display module DM, a power supply 20, a speaker for outputting sound, an input/output terminal capable of inputting or outputting several signals, and a wireless transceiver capable of transmitting or receiving a wireless signal. Therefore, various suitable control printed circuit boards constituting the controller 30, and various power supply printed circuit boards constituting the power supply 20 may be installed inside the mounting part SDP, but the present disclosure is not limited thereto. Also, the mounting part SDP may be provided with a motor controller 10 for controlling the motor.

The display module DM may display an image. For example, the display module DM may display the image in a third direction DR3, but the present disclosure is not limited thereto. For example, the display module DM may display the image in an opposite direction of the third direction DR3, or in both of the directions.

The display module DM (e.g., the display panel) may have flexibility. In an example, the display module DM may have a rolling characteristic. Accordingly, when the display device DD is in a closed mode, the display module DM may be rolled to be accommodated inside the housing HS. When the display device DD is in an open mode, the display module DM may be extracted (e.g., unwound) in the opposite direction of the rolling direction to be unrolled in one direction from the housing HS.

The display module DM may be changed from a state in which the display module DM is completely rolled to a state in which the display module DM is completely unrolled, or may be changed from the state in which the display module DM is completely unrolled to the state in which the display module DM is completely rolled. The state in which the display module DM is completely rolled may refer to a state in which the display module DM is accommodated inside the housing HS, such that the display device DD does not display any image. In some embodiments, the display module DM may be changed from the state in which the display module DM is completely rolled to a state in which only a portion of the display module DM is unrolled. The state in which only a portion of the display module DM is unrolled may refer to a state in which the portion of the display module DM is disposed at the outside of the housing HS. It should be appreciated that the display module DM may be transitioned between partially rolled and partially unrolled states, and/or an image may be displayed on a portion partially exposed in the states as needed or desired.

The display module DM may be provided in various suitable shapes. In an example, the display module DM may be provided in a rectangular plate shape having two pairs of parallel or substantially parallel sides, but the present disclosure is not limited thereto. When the display module DM is provided in the rectangular plate shape, any one pair from among the two pairs of sides may be provided longer than the other pair of sides. Although a case where the display module DM has an angled corner portion configured with straight lines is illustrated in the drawings, the present disclosure is not limited thereto.

The display module DM may include a display area DA in which an image is displayed, and a non-display area NDA provided at least at one side of the display area DA. The non-display area NDA is an area in which the image is not displayed.

In some embodiments, the display module DM may include a sensing area and a non-sensing area. The display module DM may display an image through the sensing area, and may also sense a touch input made on a display surface (or input surface) and/or sense light incident from the front of the display module DM. The non-sensing area may surround (e.g., around a periphery of) the sensing area. However, the present disclosure is not limited thereto. In some embodiments, a partial area of the display area DA may correspond to the sensing area.

Figure 4:
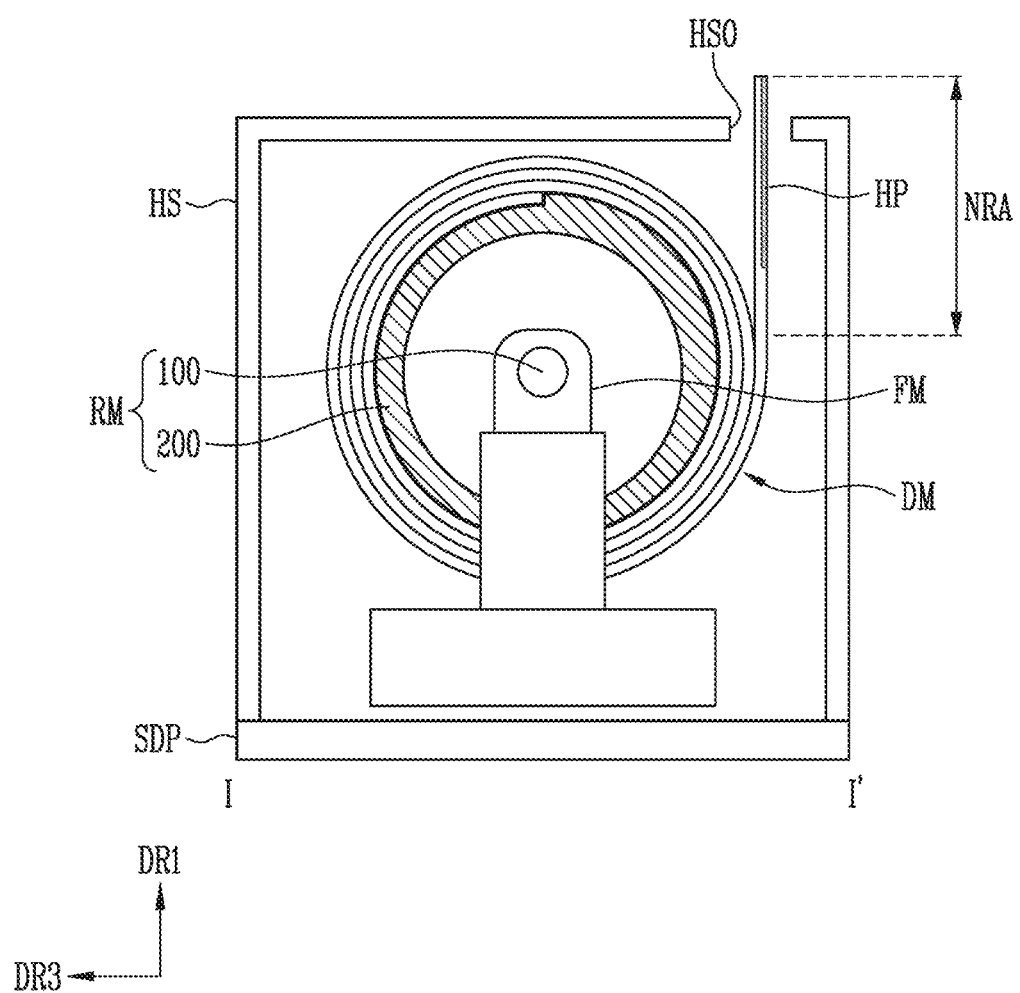
FIG. 4 is a schematic sectional view taken along the line I-I' shown in FIG. 1.

FIG. 4 is a schematic sectional view taken along the line I-I' shown in FIG. 1. FIG. 4 illustrates a state in which the display module DM is rolled.

Referring to FIGS. 1 to 4, the rotating member RM may include a rotating shaft 100 and a rotating cylinder 200 (or drum). The rotating shaft 100 may be disposed at the center (or the middle) of the rotating cylinder 200. In an example, the rotating shaft 100 may penetrate the rotating cylinder 200, and extend in one direction.

When the rotating shaft 100 is rotated in one direction (e.g., a first rotational direction), the display module DM may be rolled on the rotating cylinder 200. When the rotating shaft 100 is rotated in an opposite direction (e.g., a second rotational direction), the rolled display module DM may be unrolled (or unwound).

The holding member FM may be fixed to an inner side of the housing HS, and may support the rotating shaft 100. In other words, the rotating member RM (or the rotating shaft 100) may be held to the holding member FM. For example, the holding member FM may be fixed or coupled to (e.g., connected to or attached to) one surface of the mounting part SDP, but the present disclosure is not limited thereto. In another example, the holding member FM may be fixed to an inner surface of the housing HS.

In an embodiment, the holding member FM may vary a position of the rotating member RM inside the housing HS. For example, the holding member FM may move the rotating member RM, such that the display module DM (or the display panel) becomes distant from the slot HSO (e.g., such that the rolled display module DM is not in contact with the housing HS) in a state in which the display module DM is rolled on the rotating member RM, or while the display module DM is rolled on the rotating member RM. For example, the holding member FM may move the rotating member RM, such that the display module DM (or the display panel) becomes closer to the slot HSO in a state in which the display module DM is unrolled or while the display module DM is unrolled. When the display module DM is unrolled, there may occur a dead space (or non-driving area) of the display module DM, which is not exposed to the outside of the housing HS. The display module DM is moved to become closer to the slot HSO, so that the dead space can be decreased. For example, the holding member FM may use a cylinder apparatus, such as an air cylinder, a gas cylinder, or a hydraulic cylinder, or may vary (e.g., adjust) the position of the rotating member RM by using a motor, a rack and pinion gear, a belt, a chain, or the like.

In embodiments, the display module DM may include a heat pipe HP. Even when the display module DM is rolled to be accommodated inside the housing HS, one area (e.g., one portion) of the display module DM may not be bent or rolled, and the heat pipe HP may be disposed at (e.g., in or on) the one area (e.g., at a non-rolling area NRA) of the display module DM. For example, an end area of the display module DM in the first direction DR1 may not be bent, and the heat pipe HP may be disposed at (e.g., in or on) the end area of the display module DM. The heat pipe HP may absorb heat generated inside the display module DM (or display panel), and may discharge the heat to the outside. For example, the display module DM (or display panel) may include a heat conductive layer (e.g., a metal layer) for transferring heat therein, and the heat pipe HP may be in contact with or attached to the heat conductive layer, to perform a heat dissipation function. The heat conductive layer and the heat pipe HP will be described in more detail below with reference to FIG. 8A.

As a resolution and/or an area of the display module DM increases, power consumption and heat generation of the display module DM may be increased. The heat generation may have influence on an operation of the display module DM, and may deteriorate the quality of an image. A heat dissipation sheet may be attached to the display module DM, but the heat capacity in which the heat dissipation sheet may diffuse heat may reach a limit. Therefore, with only the heat dissipation sheet, heat may not be sufficiently diffused or discharged. In addition, when the display module DM is implemented as a rollable display module, it may not be easy to attach a heat dissipation sheet to the display module DM (e.g., a heat dissipation sheet may have a relatively large modulus, and thus, may interfere with bending and/or rolling of the display module DM). Thus, in the display device DD in accordance with the present embodiment of the present disclosure, heat generated in the display module DM may be more efficiently diffused and/or discharged by using the heat pipe HP (e.g., along with the heat conductive layer).

Figure 5A:
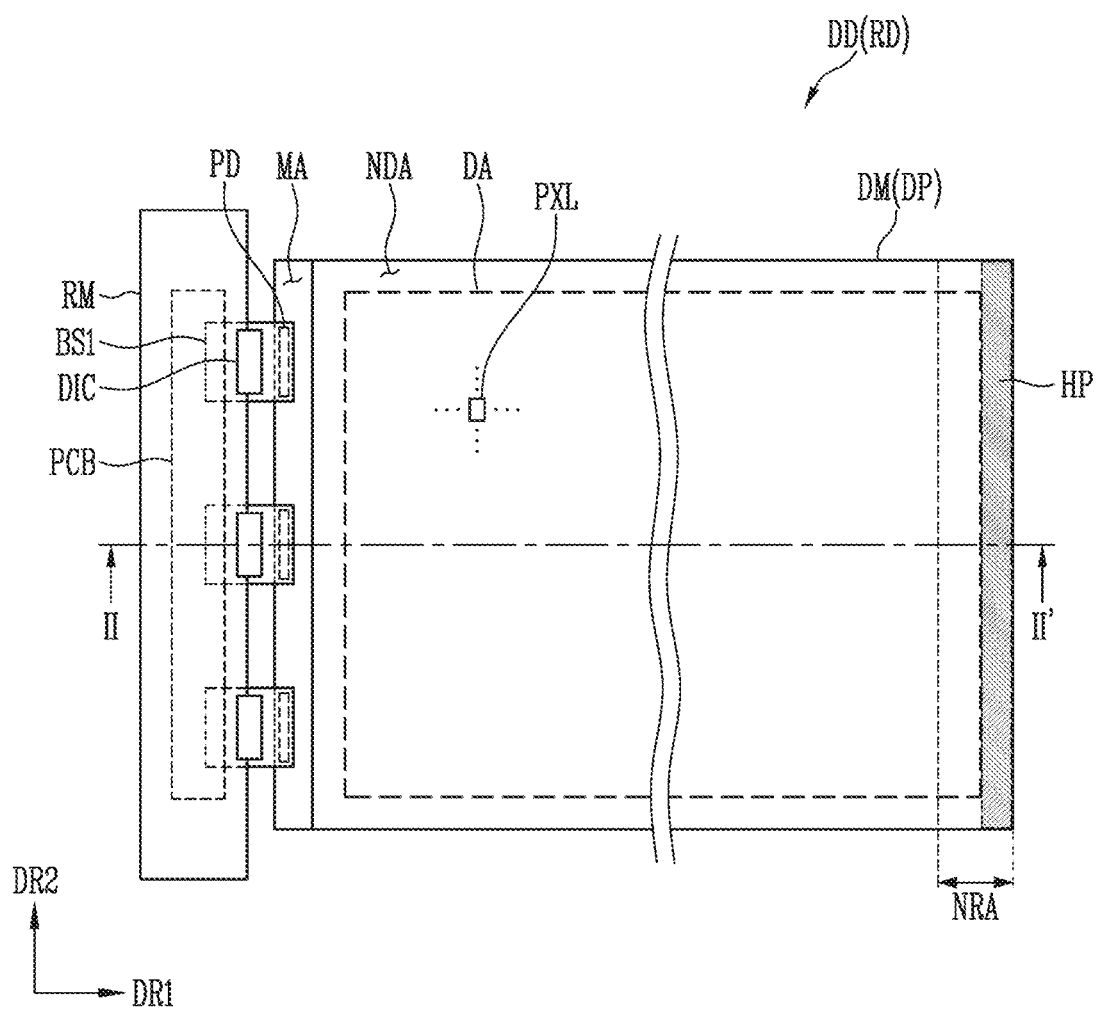
FIGS. 5A-5B are plan views schematically illustrating a portion of the display device shown in FIG. 1.
Figure 5B:
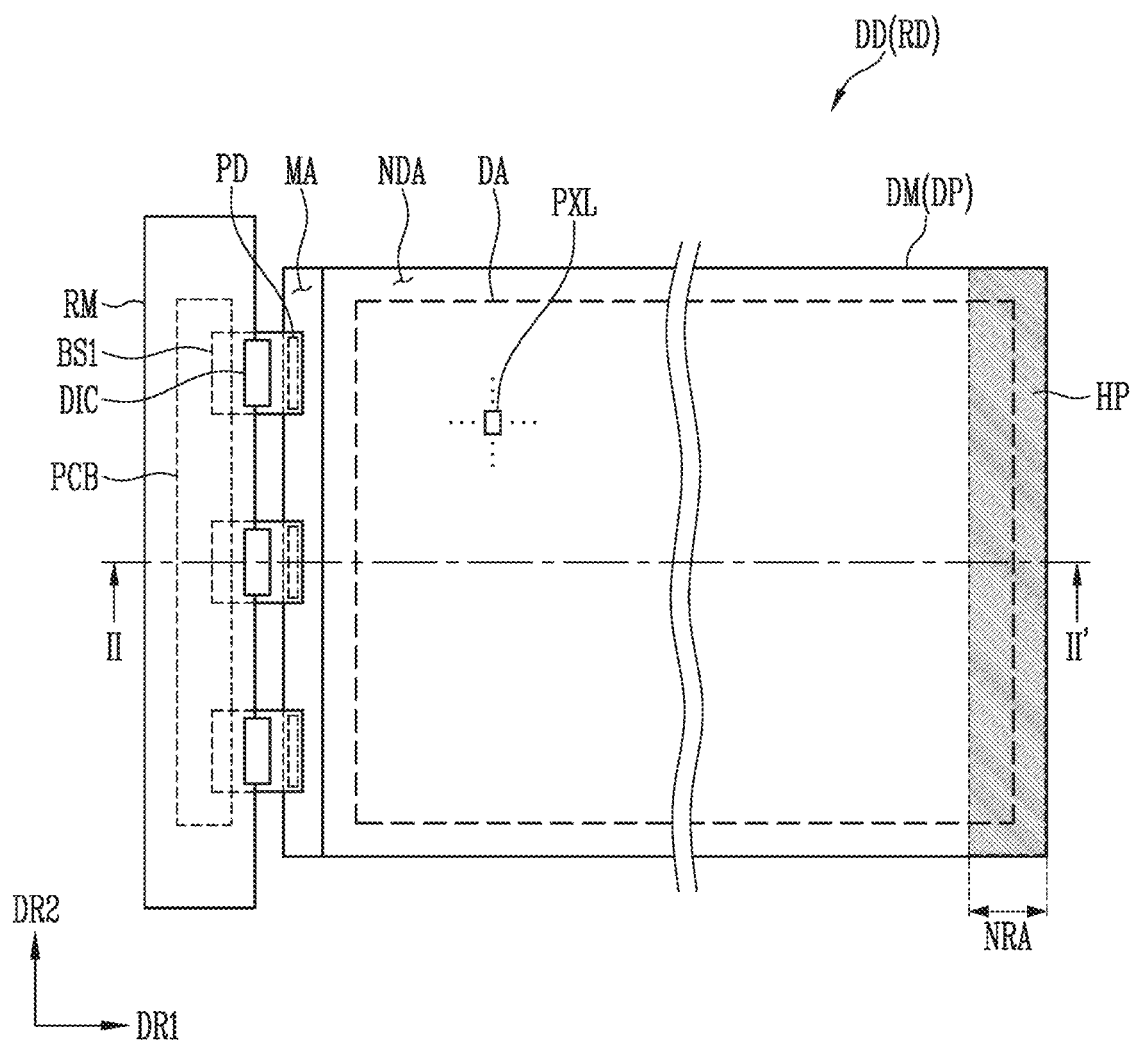
Figure 6A:
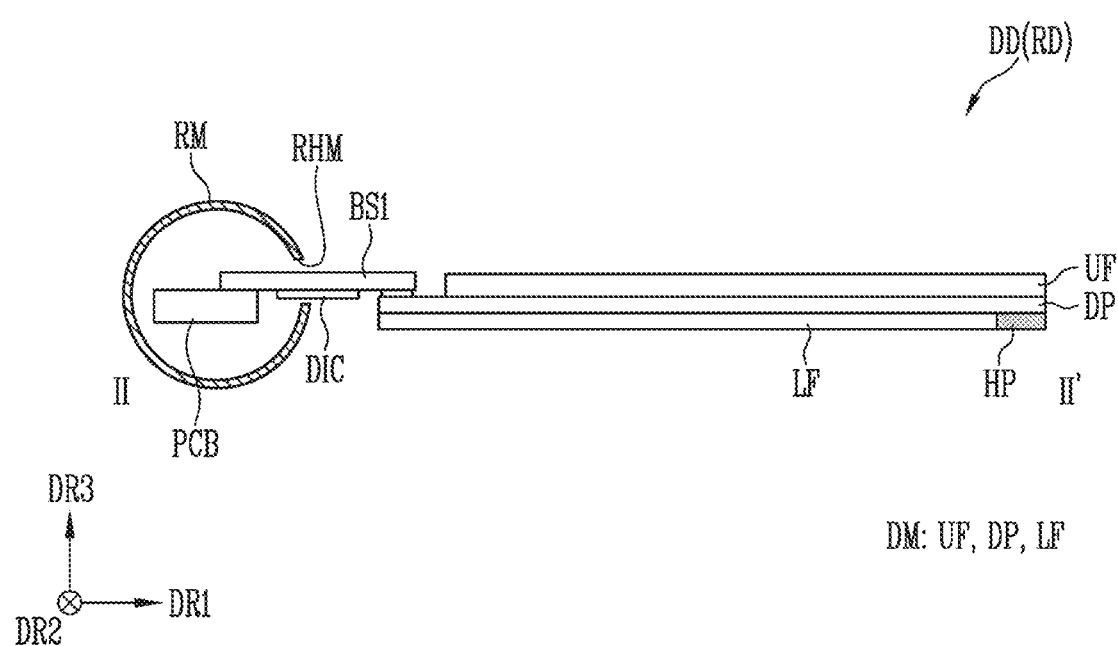
FIGS. 6A-6B are schematic sectional views taken along the line II-II' shown in FIG. 5A.
Figure 6B:
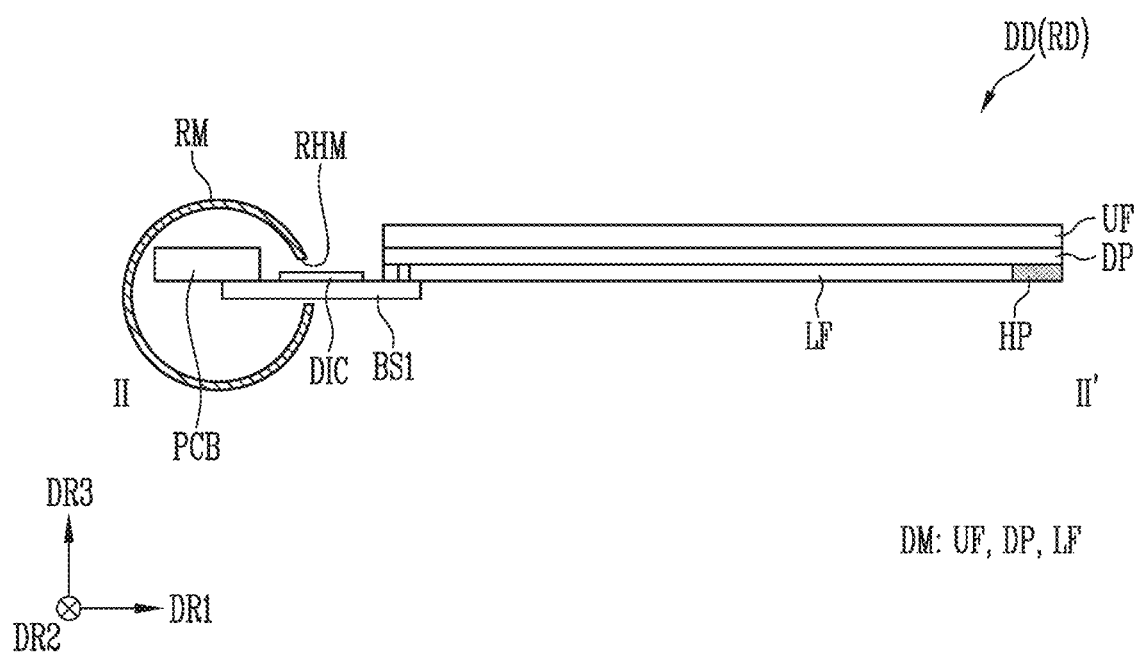

FIGS. 5A and 5B are plan views schematically illustrating a portion of the display device shown in FIG. 1. FIGS. 6A and 6B are schematic sectional views taken along the line II-II' shown in FIG. 5A.

Referring to FIGS. 1 through 4, 5A, 5B, 6A, and 6B, the display device DD may include the display module DM, a driving integrated circuit DIC, a circuit board PCB, and the rotating member RM.

The display module DM may include a display panel DP, an upper film UF (e.g., a first film), a lower film LF (e.g., a second film), and the heat pipe HP.

The display panel DP may display an image. The display panel DP may be an organic light emitting display panel (e.g., an OLED panel) including an organic light emitting diode as a light emitting element, or an inorganic light emitting display panel including, as a light emitting element, an inorganic light emitting diode, such as a light emitting diode having a micro size or a nano size, or a quantum dot light emitting diode. However, the display panel DP is not limited thereto.

The display panel DP (e.g., the display module DM) may include a display area DA and a non-display area NDA. The display area DA may be an area in which pixels PXL are provided to display an image. The non-display area NDA is an area in which the pixels PXL are not provided, and may be an area that does not display an image.

The non-display area NDA may be provided at least at one side of the display area DA. The non-display area NDA may surround (e.g., around) the circumference (e.g., an edge or a periphery) of the display area DA. A line part connected to the pixels PXL, and the driving integrated circuit DIC, which is connected to the line part and drives the pixels PXL, may be provided at (e.g., in or on) the non-display area NDA. The non-display area NDA may include a mounting area MA, in which the circuit board PCB is coupled to (e.g., connected to or attached to) the display panel DP. In an example, the mounting area MA may be one area of the non-display area NDA. A pad part PD including a plurality of pads may be located at (e.g., in or on) the mounting area MA. The pad part PD may be physically and/or electrically connected to the circuit board PCB through a conductive adhesive member. Also, the pad part PD may be electrically connected to the driving integrated circuit DIC through the circuit board PCB. The conductive adhesive member may include an anisotropic conductive film.

The line part may electrically connect the driving integrated circuit DIC and the pixels PXL to each other. The line part may include signal lines (e.g., fan-out lines connected to a scan line, a data line, and the like) that provide a signal to each corresponding pixel PXL, and are connected to each corresponding pixel PXL.

The pixels PXL may be provided at (e.g., in or on) the display area DA of the display module DM (or the display panel DP). For convenience of illustration, only one pixel PXL is illustrated in FIGS. 5A and 5B, but a plurality of pixels PXL may be provided or substantially provided at (e.g., in or on) the display module DM (or the display panel DP). Each of the pixels PXL may be a minimum unit for displaying an image. Each of the pixels PXL may include a light emitting element for emitting white light and/or colored light. Each of the pixels PXL may emit light of any one color from among red, green, and blue. However, the present disclosure is not limited thereto, and each of the pixels PXL may emit light of a color including cyan, magenta, yellow, and/or the like.

The pixels PXL may be arranged in a matrix form along rows extending in the first direction DR1 and columns extending in the second direction DR2. However, the arrangement form of the pixels PXL is not particularly limited thereto, and the pixels PXL may be arranged in various suitable forms. Although a case where the pixels PXL have a rectangular shape is illustrated in the drawings, the present disclosure is not limited thereto, and the pixels PXL may be modified to have various suitable shapes.

In addition, when the pixel PXL is provided in a plurality, the plurality of pixels PXL may be provided to have different areas (or sizes) from one another. For example, in the case of pixels PXL that emit light of different colors from one another, the pixels PXL with respect to the different colors may be provided in different areas (or sizes) or different shapes from one another.

The upper film UF may be disposed on (e.g., a top or front of) the display panel DP, and the lower film LF may be disposed under (e.g., on a bottom or rear of) the display panel DP. The upper film UF and the lower film LF may protect the display panel DP from external impacts. In some embodiments, the upper film UF may provide an input surface and/or a display surface to a user.

In an embodiment, the upper film UF and the lower film LF may be configured with a material having a relatively low modulus, and a relatively high ductility as compared with those of the display panel DP (e.g., or those of the layers constituting the display panel DP). For example, the upper film UF and the lower film LF may include at least one of thermoplastic polyurethane (TPU), polyurethane (PU), polydimethylsiloxane (PDMS), and polyamide (PA).

When the upper film UF and the lower film LF are disposed on both surfaces (e.g., opposite surfaces) of the display panel DP, shear stress acting on the display panel DP, and rolling stiffness according to rolling thereof, may be decreased, and occurrence of buckling and cracks in the display panel DP may be prevented or reduced.

Each of the upper film UF and the lower film LF may be coupled to (e.g., connected to or attached to) the display panel DP by using an adhesive layer. The adhesive layer may include an optically clear adhesive material.

In some embodiments, the display panel DP may have a thickness of about 40 μm to about 50 μm, the upper film UF may have a thickness of about 72 μm to about 140 μm, and the lower film LF may have a thickness of about 360 μm to about 1.7 mm.

The thickness of the upper film UF and the thickness of the lower film LF may be variously modified according to design conditions, such as a curvature radius and/or a stiffness, of the display module DM.

In various embodiments, the heat pipe HP may be disposed at (e.g., in or on) an end area of the display panel DP in the first direction DR1 (e.g., at the non-rolling area NRA). The heat pipe HP may be disposed at a lower portion of the display panel DP. For example, an end area of the display panel DP (e.g., an end area of a lower surface or rear surface of the display panel DP) may be exposed by the lower film LF, and the heat pipe HP may be disposed at (e.g., in or on) the exposed end area. On a plane (e.g., in a plan view), the heat pipe HP may not overlap with the lower film LF.

As shown in FIG. 5A, on a plane (e.g., in a plan view), the heat pipe HP may be disposed at (e.g., in or on) the non-display area NDA of the display module DM. An influence that a function of the heat pipe HP (e.g., along with a heat conductive layer described in more detail below) has on the pixel PXL at (e.g., in or on) the display area DA may be minimized or reduced. However, the present disclosure is not limited thereto. For example, as shown in FIG. 5B, on a plane (e.g., in a plan view), the heat pipe HP may be disposed at (e.g., in or on) the non-display area NDA, and even at (e.g., in or on) a portion of the display area DA of the display module DM.

The driving integrated circuit DIC may be mounted on one surface of a base layer BS1 (e.g., a base substrate or a flexible circuit board) to be electrically connected to the circuit board PCB and the pad part PD. The driving integrated circuit DIC may receive signals output from the circuit board PCB, and may output suitable signals (e.g., predetermined signals), a driving voltage, and the like, which are to be provided to the pixels PXL, based on the received signals. The suitable signals (e.g., the predetermined signals) and the driving voltage, which have been described above, may be transferred to the pixels PXL through the pad part PD. As shown in FIG. 6A, the base layer BS1 may be coupled to (e.g., connected to or attached to) an upper surface (e.g., a front surface) of the display panel DP, but the present disclosure is not limited thereto. For example, as shown in FIG. 6B, an opening exposing the display panel DP may be formed in the lower film LF, and the base layer BS1 may be coupled to (e.g., connected to or attached to) the lower surface (e.g., the rear surface) of the display panel DP through the opening of the lower film LF.

The circuit board PCB may supply image data, a control signal, a power voltage, and the like to the display panel DP. The circuit board PCB may be a flexible line board or a rigid line board.

In some embodiments, at least a portion of the circuit board PCB may be located inside the rotating member RM. An internal space, in which the circuit board PCB and at least a portion of the base layer BS1 are accommodated, may be provided in the rotating member RM. A fastening groove RHM through which the base layer BS1 is fastened may be provided in one area of the rotating member RM.

In some embodiments, the circuit board PCB may be located inside the rotating member RM, so that a portion of the display panel DP is accommodated in the rotating member RM, or is physically coupled to (e.g., connected to or attached to) the rotating member RM. For example, the display panel DP may penetrate into the rotating member RM through the fastening groove RHM. When a portion of the display panel DP is accommodated in the rotating member RM, or is coupled to (e.g., connected to or attached to) the rotating member RM, a step difference caused by another component (e.g., such as the base layer BS1) may not occur in a process of rolling the display panel DP onto the rotating member RM, and the display panel DP may be entirely or substantially entirely rolled with a constant or substantially constant curvature. In addition, in a process of repeatedly rolling and unrolling the display panel DP, a defect (e.g., such as damage, a change in line resistance, or the like) that may be caused by bending, contact, or the like of the base layer BS1 and/or the circuit board PCB may be prevented or substantially prevented.

Figure 7A:
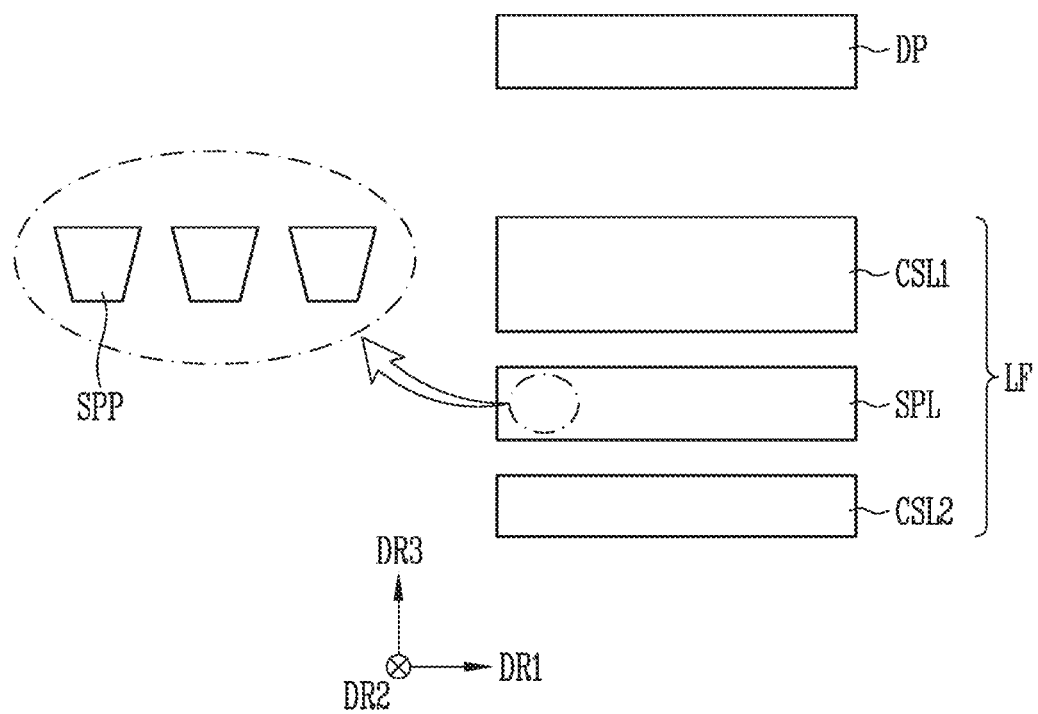
FIG. 7A is a sectional view illustrating an embodiment of a lower film included in the display device shown in FIGS. 6A and 6B.

FIG. 7A is a sectional view illustrating an embodiment of the lower film included in the display device shown in FIGS. 6A and 6B.

Referring to FIGS. 6A, 6B, and 7A, the lower film LF may include a first cushion layer CSL1, a support layer SPL disposed on a bottom of the first cushion layer CSL1, and a second cushion layer CSL2 disposed on a bottom of the support layer SPL, which are sequentially disposed on the bottom (e.g., the rear) of the display panel DP. The first cushion layer CSL1, the support layer SPL, and the second cushion layer CSL2 may be coupled to (e.g., connected to or attached to) each other through an adhesive layer interposed therebetween. The first cushion layer CSL1, the support layer SPL, and the second cushion layer CSL2 may also be coupled to (e.g., connected to or attached to) the bottom of the display panel DP through an adhesive layer.

The first cushion layer CSL1 and the second cushion layer CSL2 may include an elastomer having excellent deformation and resilience. For example, each of the first cushion layer CSL1 and the second cushion layer CSL2 may include thermoplastic polyurethane, polyurethane, polydimethylsiloxane, polyamide, and/or the like. The first cushion layer CSL1 and the second cushion layer CSL2 disperse stress occurring in the rolling of the display panel DP, thereby preventing or substantially preventing the layers included in the display panel DP from being pushed or separated (e.g., exfoliated) therebetween by the stress.

In an embodiment, a modulus of the first cushion layer CSL1 may be different from a modulus of the second cushion layer CSL2. For example, the modulus of the first cushion layer CSL1 and the modulus of the second cushion layer CSL2 may become lower as they become more distant from the display panel DP. For example, the modulus of the second cushion layer CSL2 may be lower than the modulus of the first cushion layer CSL1.

When the lower film LF includes a plurality of cushion layers (e.g., the first cushion layer CSL1 and the second cushion layer CSL2), and in more detail, when the lower film LF includes the plurality of cushion layers having different moduli from one another, the layers included in the display panel DP may be more effectively prevented or substantially prevented from being pushed or separated (e.g., exfoliated) therebetween.

The first cushion layer CSL1 and the second cushion layer CSL2 may have different thicknesses from each other. For example, when the display panel DP has a thickness of about 46 μm, the first cushion layer CSL1 may have a thickness of about 200 μm, and the second cushion layer CSL2 may have a thickness of about 80 μm. However, the present disclosure is not limited thereto, and the thickness of the first cushion layer CSL1 and the thickness of the second cushion layer CSL2 are not particularly limited thereto.

The support layer SPL may be disposed between the first cushion layer CSL1 and the second cushion layer CSL2, and may support the display panel DP. For example, the support layer SPL may prevent or substantially prevent wrinkles from occurring in the display panel DP (e.g., or the lower film LF). Thus, the support layer SPL may include a material having rigidity.

In an embodiment, the support layer SPL may include a plurality of support patterns SPP spaced apart (e.g., separated) from each other. The support patterns SPP may be configured with a metal, such as steel use stainless (SUS) or stainless steel, invar, or plastic. For example, each of the support patterns SPP may extend in the second direction DR2, and the support patterns SPP may be arranged along the first direction DR1. The support layer SPL may be flexibly deformed, and rolled together with the display panel DP. Resin, silicon, or the like may be filled between the support patterns SPP.

For example, the support layer SPL may have a thickness within a range of about 80 μm to about 1.6 mm. The thickness of the support layer SPL may be variously modified according to design conditions, such as a curvature radius, a rigidity, and/or the like, of the display module DM.

Although a case where the support patterns SPP are spaced apart from each other is illustrated in FIG. 7A, the present disclosure is not limited thereto. For example, the support patterns SPP may be integrally formed, and a concave part (e.g., a groove) or a hole may be formed between the support patterns SPP.

Also, although a case where each of the support patterns SPP has a sectional shape of a trapezoid is illustrated in FIG.

7A, the present disclosure is not limited thereto. For example, each of the support pattern SPP may have a sectional shape of a quadrangle, a triangle, an ellipse, or the like.

Figure 7B:
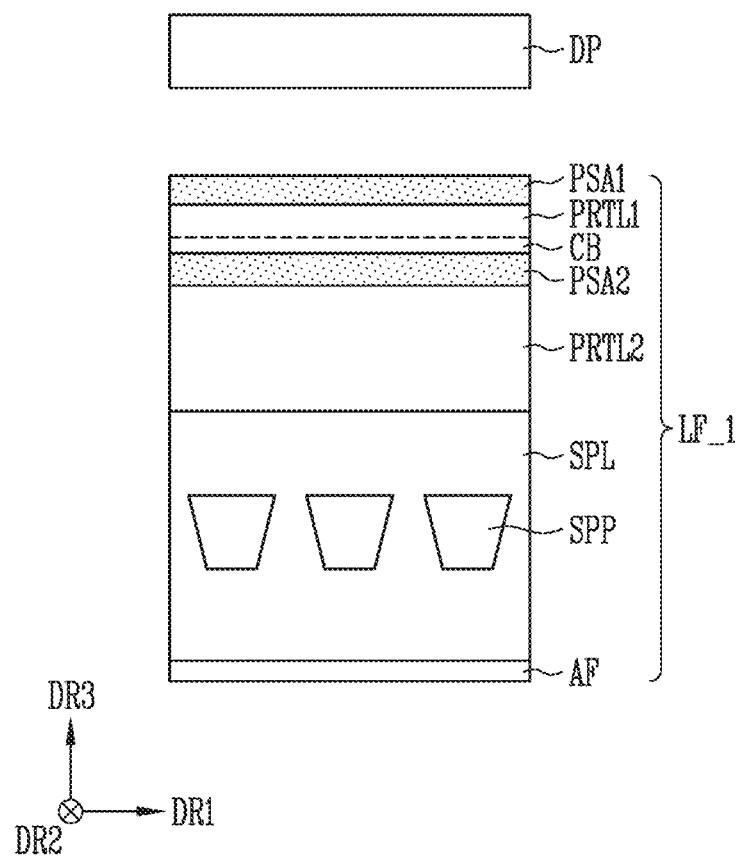
FIG. 7B is a sectional view illustrating another embodiment of the lower film included in the display device shown in FIGS. 6A and 6B.

FIG. 7B is a sectional view illustrating another embodiment of the lower film included in the display device shown in FIGS. 6A and 6B.

Referring to FIGS. 6A, 6B, and 7B, a lower film LF_1 may include a first protective layer PRTL1, a reinforcing layer CB, a second protective layer PRTL2, a support layer SPL, and a functional layer AF, which are sequentially disposed on the bottom (e.g., the rear) of the display panel DP. At least some of the first protective layer PRTL1, the reinforcing layer CB, the second protective layer PRTL2, the support layer SPL, and the functional layer AF may be coupled to (e.g., connected to or attached to) each other through an adhesive layer interposed therebetween. Also, at least some of the first protective layer PRTL1, the reinforcing layer CB, the second protective layer PRTL2, the support layer SPL, and the functional layer AF may be coupled to (e.g., connected to or attached to) the lower surface (e.g., the rear surface) of the display panel DP through an adhesive layer. For example, the first protective layer PRTL1 may be coupled to (e.g., connected to or attached to) the lower surface of the display panel DP through a first adhesive layer PSA1, and the second protective layer PRTL2 may be coupled to (e.g., connected to or attached to) a lower surface (e.g., a rear surface) of the first protective layer PRTL1 (e.g., or the reinforcing layer CB) through a second adhesive layer PSA2. The first adhesive layer PSA1 and the second adhesive layer PSA2 may include a pressure sensitive adhesive, but the present disclosure is not limited thereto. In addition, each of the first adhesive layer PSA1 and the second adhesive layer PSA2 may have a thickness of about 25 μm, but the present disclosure is not limited thereto.

The first protective layer PRTL1 and the second protective layer PRTL2 may be protective films that protect the lower surface of the display panel DP. The first protective layer PRTL1 and the second protective layer PRTL2 may be the same or substantially the same as (or similar to) the first cushion layer CSL1 and the second cushion layer CSL2 (e.g., see FIG. 7A), respectively. Therefore, redundant description thereof may not be repeated.

The first protective layer PRTL1 may include polyimide (PI), aramid, cellulose fiber, and/or the like. For example, the first protective layer PRTL1 may include polyimide. The first protective layer PRTL1 may have a thickness of about 25 μm, but the present disclosure is not limited thereto.

The second protective layer PRTL2 may include polyamide (PA), poly methyl methacrylate (PMMA), polyether block amid (PEBA)-based polymer, silicon-based polymer, or urethane-based polymer. For example, the second protective layer PRTL2 may include PEBA-based polymer. The second protective layer PRTL2 may have a thickness of about 100 μm, but the present disclosure is not limited thereto.

In an embodiment, each of the first protective layer PRTL1 and the second protective layer PRTL2 may have a single-layer structure or a multi-layered structure.

For example, the first protective layer PRTL1 may include a layer including polyimide, and the reinforcing layer CB disposed on the bottom (e.g., the rear) of the layer. The reinforcing layer CB may include carbon black, but the present disclosure is not limited thereto. The reinforcing layer CB may have a thickness of about 10 μm, but the present disclosure is not limited thereto.

The support layer SPL may support the display panel DP. The support layer SPL may be the same or substantially the same as (or similar to) the support layer SPL described above with reference to FIG. 7A, and therefore, redundant description thereof may not be repeated.

The functional layer AF may include at least one of an anti-finger coating layer, an anti-fouling coating layer, an anti-reflection coating layer, an anti-glare coating layer, and a hard-coating layer. The functional layer AF may have a thickness of about 1 μm, but the present disclosure is not limited thereto.

As described above with reference to FIGS. 7A and 7B, the lower films LF and LF_1 include the first and second cushion layers CSL1 and CSL2, or the first and second protective layers PRTL1 and PRTL2, in addition to the support layer SPL, and the arrangement positions, thicknesses, and the like of the first and second cushion layers CSL1 and CSL2, or the first and second protective layers PRTL1 and PRTL2, may be variously modified.

Figure 7C:
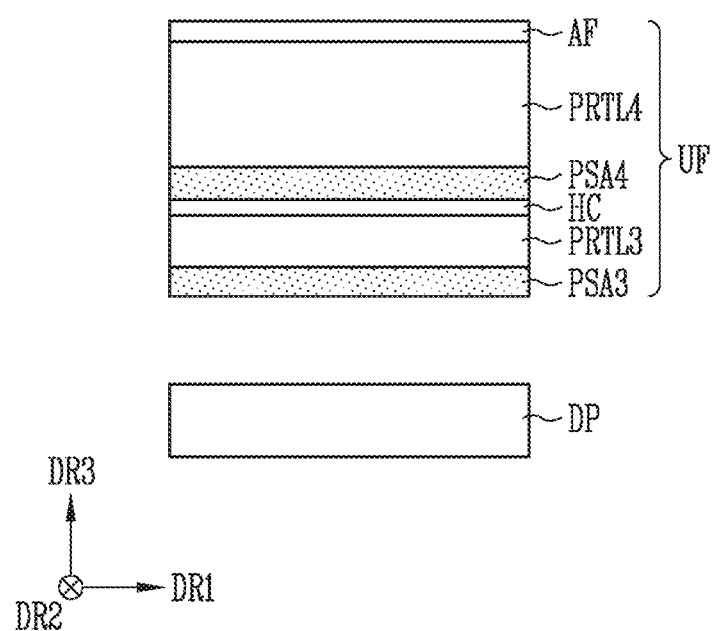
FIG. 7C is a sectional view illustrating an embodiment of an upper film included in the display device shown in FIGS. 6A and 6B.

FIG. 7C is a sectional view illustrating an embodiment of the upper film included in the display device shown in FIGS. 6A and 6B.

Referring to FIGS. 6A, 6B, and 7C, the upper film UF may include a third protective layer PRTL3, a hard coating layer HC, a fourth protective layer PRTL4, and a functional layer AF, which are sequentially disposed on the display panel DP. At least some of the third protective layer PRTL3, the hard coating layer HC, the fourth protective layer PRTL4, and the functional layer AF may be coupled to (e.g., connected to or attached to) each other through an adhesive layer interposed therebetween. Also, at least some of the third protective layer PRTL3, the hard coating layer HC, the fourth protective layer PRTL4, and the functional layer AF may be coupled to (e.g., connected to or attached to) the upper surface (e.g., the front surface) of the display panel DP through an adhesive layer. For example, the third protective layer PRTL3 may be coupled to (e.g., connected to or attached to) the upper surface of the display panel DP through a third adhesive layer PSA3, and the fourth protective layer PRTL4 may be coupled to (e.g., connected to or attached to) an upper surface (e.g., a front surface) of the third protective layer PRTL3 (e.g., or the hard coating layer HC) through a fourth adhesive layer PSA4. The third adhesive layer PSA3 and the fourth adhesive layer PSA4 may include a pressure sensitive adhesive, but the present disclosure is not limited thereto. In addition, each of the third adhesive layer PSA3 and the fourth adhesive layer PSA4 may have a thickness of about 25 μm, but the present disclosure is not limited thereto.

The third protective layer PRTL3 and the fourth protective layer PRTL4 may be protective films that protect the upper surface of the display panel DP.

The third protective layer PRTL3 and the fourth protective layer PRTL4 may be the same or substantially the same as (or similar to) the first protective layer PRTL1 and the second protective layer PRTL2 (e.g., see FIG. 7B), or as the first cushion layer CSL1 and the second cushion layer CSL2 (e.g., see FIG. 7A), respectively. Therefore, redundant description thereof may not be repeated.

The third protective layer PRTL3 and the fourth protective layer PRTL4 disperses stress occurring in the rolling of the display panel DP, thereby preventing or substantially preventing the layers included in the display panel DP from being pushed or separated (e.g., exfoliated) therebetween by the stress.

The third protective layer PRTL3 may include at least one of a clear polyimide (CPI), polyamideimide (PAI), polyetheretherketone (PEEK), and polyetherimide (PEI). For example, the third protective layer PRTL3 may include a clear polyimide (e.g., CPI). The third protective layer PRTL3 may have a thickness of about 40 µm, but the present disclosure is not limited thereto.

The fourth protective layer PRTL4 may include polyamide (PA), poly methyl methacrylate (PMMA), polyether block amid (PEBA)-based polymer, silicon-based polymer, or urethane-based polymer. For example, the fourth protective layer PRTL4 may include polyether block amid (e.g., PEBA)-based polymer. The fourth protective layer PRTL4 may have a thickness of about 100 µm, but the present disclosure is not limited thereto.

In an embodiment, a modulus of the third protective layer PRTL3 may be different from a modulus of the fourth protective layer PRTL4. For example, the modulus of the third protective layer PRTL3 and the modulus of the fourth protective layer PRTL4 may become lower as they become more distant from the display panel DP. For example, the modulus of the fourth protective layer PRTL4 may be lower than the modulus of the third protective layer PRTL3.

The hard coating layer HC may be disposed on the third protective layer PRTL3. The hard coating layer HC reduces a distortion or a come-off phenomenon of the third protective layer PRTL3 (or the upper film UF) in a severe condition, such as high temperature or high humidity, thereby improving reliability. In addition, the hard coating layer HC may absorb external impacts. The hard coating layer HC may have a thickness of about 1.5 µm, but the present disclosure is not limited thereto.

The functional layer AF may include at least one of an anti-finger coating layer, an anti-fouling coating layer, an anti-reflection coating layer, an anti-glare coating layer, and a hard-coating layer, as described above with reference to FIG. 7B. The functional layer AF may have a thickness of about 1 µm to about 1.3 µm, but the present disclosure is not limited thereto.

Similar to the lower films LF and LF_1 shown in FIGS. 7A and 7B, the upper film UF may include a plurality of protective layers (e.g., the third and fourth protective layers PRTL3 and PRTL4) having different moduli from one another. The upper film UF along with the lower films LF and LF_1 may prevent or substantially prevent the layers included in the display panel DP from being pushed or separated (e.g., exfoliated) therebetween.

Figure 8A:
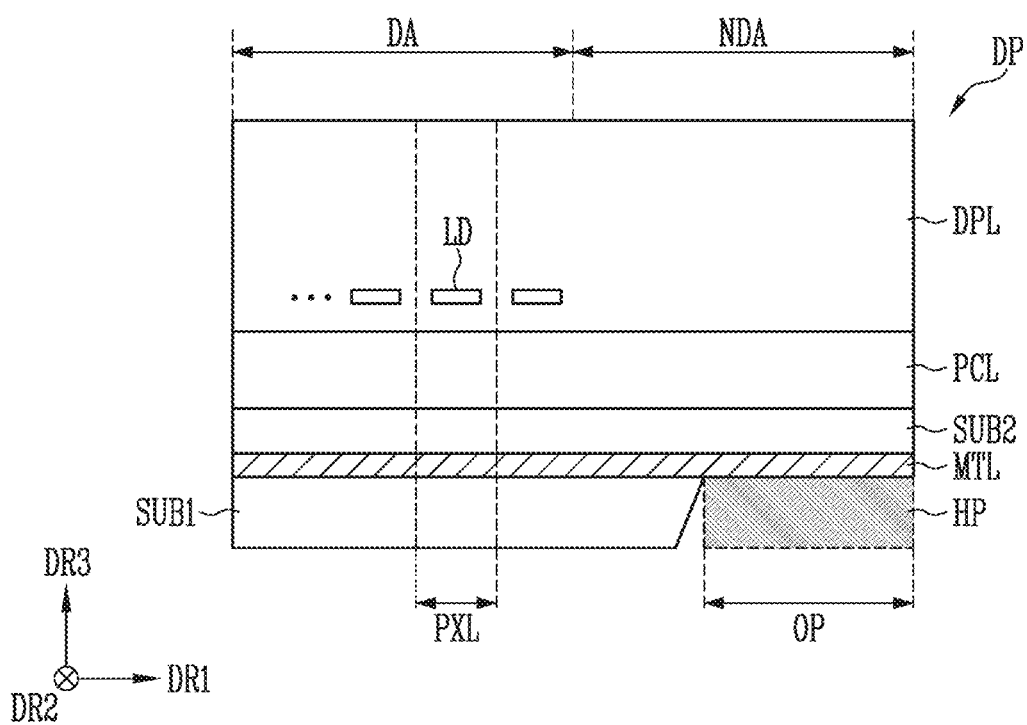
FIGS. 8A-8B are sectional views illustrating one or more embodiments of a display panel included in the display device shown in FIGS. 6A and 6B.
Figure 8B:
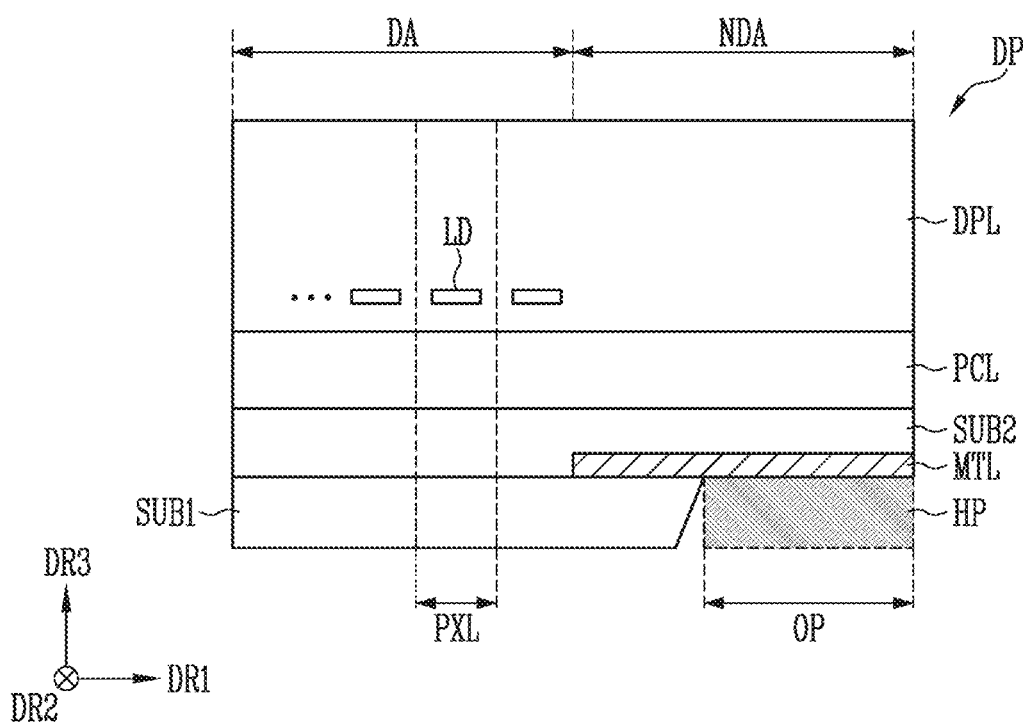

FIGS. 8A and 8B are sectional views illustrating one or more embodiments of the display panel included in the display device shown in FIGS. 6A and 6B. In FIGS. 8A and 8B, a section of an end portion of the display panel DP shown in FIGS. 6A and 6B in the first direction DR1 is schematically illustrated. FIG. 9 is a plan view illustrating an embodiment of a heat pipe included in the display panel shown in FIGS. 8A and 8B.

First, referring to FIGS. 5A, 5B, 6A, 6B, 8A, and 8B, the display panel DP may include a first substrate SUB1 (e.g., a first base layer), a heat conductive layer MTL (e.g., a metal layer), a second substrate SUB2 (e.g., a second base layer), a pixel circuit layer PCL, and a display element layer DPL.

Each of the first substrate SUB1 and the second substrate SUB2 may have flexibility. At least a portion of the first substrate SUB1 and the second substrate SUB2 may be windable or rollable with respect to one side thereof. For example, like the display module DM shown in FIGS. 4 and 5A, the first substrate SUB1 and the second substrate SUB2 may be bent and/or rolled with respect to one side in the opposite direction of the first direction DR1.

Each of the first substrate SUB1 and the second substrate SUB2 may be made of a material having a suitable flexibility to be bendable and/or foldable, and may have a single-layer structure or a multi-layered structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. For example, each of the first substrate SUB1 and the second substrate SUB2 may include polyimide, but the present disclosure is not limited thereto.

The heat conductive layer MTL may be disposed between the first substrate SUB1 and the second substrate SUB2. The heat conductive layer MTL may transfer heat generated in the pixel circuit layer PCL toward the heat pipe HP. The heat conductive layer MTL may be electrically separated (e.g., electrically insulated) from the pixel circuit layer PCL (or a transistor included in the pixel circuit layer PCL). In other words, the heat conductive layer MTL is a component for heat transfer, and may not transfer any electrical signal.

The heat conductive layer MTL may be entirely or substantially entirely disposed on the bottom (e.g., the rear) of the second substrate SUB2, to cover a lower surface (e.g., a rear surface) of the second substrate SUB2, or may be disposed on a portion (e.g., on only a portion) of the second substrate SUB2. For example, as shown in FIG. 8A, the heat conductive layer MTL may be disposed at (e.g., in or on) the non-display area NDA and the display area DA on the lower surface of the second substrate SUB2. In another example, as shown in FIG. 8B, the heat conductive layer MTL may be disposed at (e.g., in or on) the non-display area NDA, and may not overlap with a light emitting element LD (e.g., connected to a pixel circuit, or a pixel PXL) in the display element layer DPL. An influence (e.g., a parasitic capacitance and/or a signal delay) that the heat conductive layer MTL may have on the display area DA may be reduced or excluded.

In an embodiment, the heat conductive layer MTL may include a metal having high heat conductivity. For example, the heat conductive layer MTL may include a metal, such as silver (Ag), copper (Cu), aluminum (Al), magnesium (Mg), nickel (Ni), or any suitable alloy thereof. However, the present disclosure is not limited thereto, and the heat conductive layer MTL may include a carbon material (e.g., graphene), a ceramic material (e.g., silicon carbide (SiC)), and/or the like, which have high heat conductivity. In other words, within a range of high heat conductivity, the material of the heat conductive layer MTL is not particularly limited.

In an embodiment, an opening OP (e.g., an opening part) exposing the heat conductive layer MTL may be formed in the first substrate SUB1, and the heat pipe HP may be in contact with the heat conductive layer MTL through the opening OP. For example, as shown in FIGS. 8A, 8B, and 9, the opening OP may be formed in an end portion of the first substrate SUB1 in the first direction DR1, and the heat pipe HP may be disposed in the opening OP. On a plane (e.g., in a plan view), the heat pipe HP may be disposed at (e.g., in or on) an end area of the second substrate SUB2, which does not overlap with the first substrate SUB1. As described above with reference to FIGS. 4, 5A, and 5B, the area at (e.g., in or on) which the heat pipe HP is disposed may be the non-rolling area NRA, and the second substrate SUB2 (and the first substrate SUB1) may also not be wound (or rolled) in the non-rolling area NRA.

The heat pipe HP may be a heat conductor having a sealed metal tube shape. For example, the heat pipe HP may include a metal pipe having a suitable internal shape (e.g., a specific or predetermined internal shape), and a refrigerant filled inside the metal pipe. The refrigerant may be determined according to a temperature to be used. For example, water, ammonia, Freon, methanol, ethanol, and/or the like may be used as the refrigerant. The metal pipe may have a hollow interior, and may include a wick formed in an inner wall thereof. The refrigerant in a liquid state may move along the wick, and the refrigerant in a gaseous state may move through the hollow interior. For example, the wick may be configured as a powder type wick obtained by sintering metal powder, a mesh type wick having fabric tissue made of metal fiber, or a groove type wick. As shown in FIG. 9, when the heat pipe HP includes a metal tube, the metal tube may extend in the first direction DR1, but the present disclosure is not limited thereto. For example, the heat pipe HP may be configured with one metal tube, and may entirely extend in the second direction DR2, while partially reciprocating in the first direction DR1 (e.g., while having a zigzag shape).

The pixel circuit layer PCL may be provided on the second substrate SUB2. The pixel circuit layer PCL may include a plurality of transistors, and signal lines connected to the transistors. For example, each transistor may have a form in which a semiconductor layer, a gate electrode, a first terminal, and a second terminal are sequentially stacked on one another with an insulating layer interposed therebetween. The semiconductor layer may include amorphous silicon, poly-silicon, low temperature poly-silicon, an organic semiconductor, and/or an oxide semiconductor. The gate electrode, the first terminal, and the second terminal may include one of aluminum, copper, titanium, and molybdenum, but the present disclosure is not limited thereto. Also, the pixel circuit layer PCL may include at least one insulating layer.

The display element layer DPL may be disposed on the pixel circuit layer PCL. The display element layer DPL may include a light emitting element LD for emitting light. The light emitting element LD may be disposed at (e.g., in or on) the display area DA. For example, the light emitting element LD may be an inorganic light emitting element including an inorganic light emitting material, or a light emitting element for emitting light by changing a wavelength of incident light by using a quantum dot. However, the present disclosure is not limited thereto. For example, the light emitting element LD may be an organic light emitting diode.

A cover layer (e.g., an encapsulation layer) may be selectively disposed on the display element layer DPL. The cover layer may be provided in the form of an encapsulation substrate, or in the form of an encapsulation layer configured as multi-layers. When the cover layer is provided in the form of the encapsulation layer, the cover layer may include an inorganic layer and/or an organic layer. For example, the cover layer may have a form in which an inorganic layer, an organic layer, and an inorganic layer are sequentially stacked on one another. The cover layer may prevent or substantially prevent external air and/or moisture from infiltrating into the display element layer DPL and the pixel circuit layer PCL.

Figure 10A:
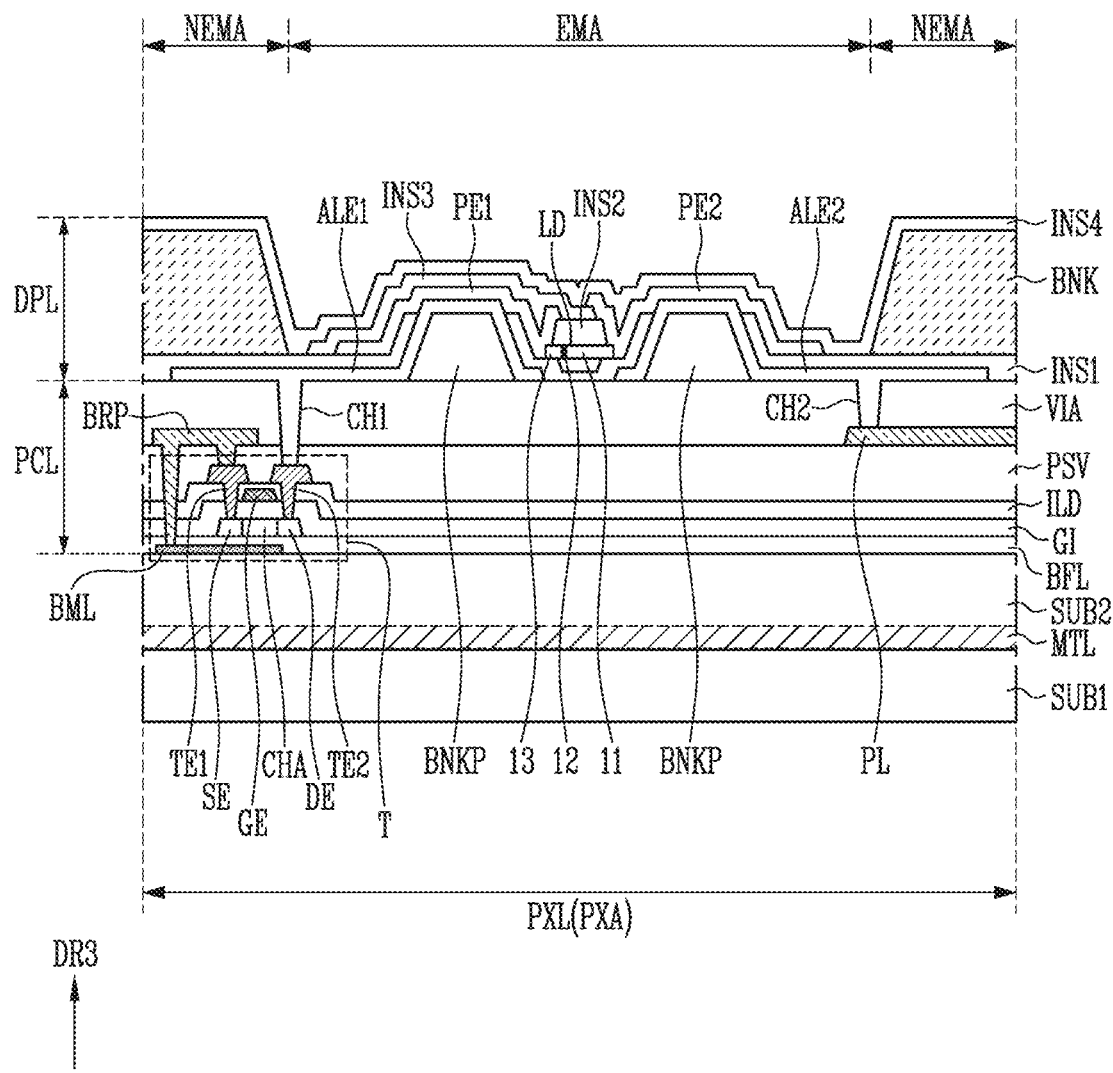
FIGS. 10A-10B are sectional views illustrating one or more embodiments of a pixel included in the display panel shown in FIGS. 8A and 8B.
Figure 10B:
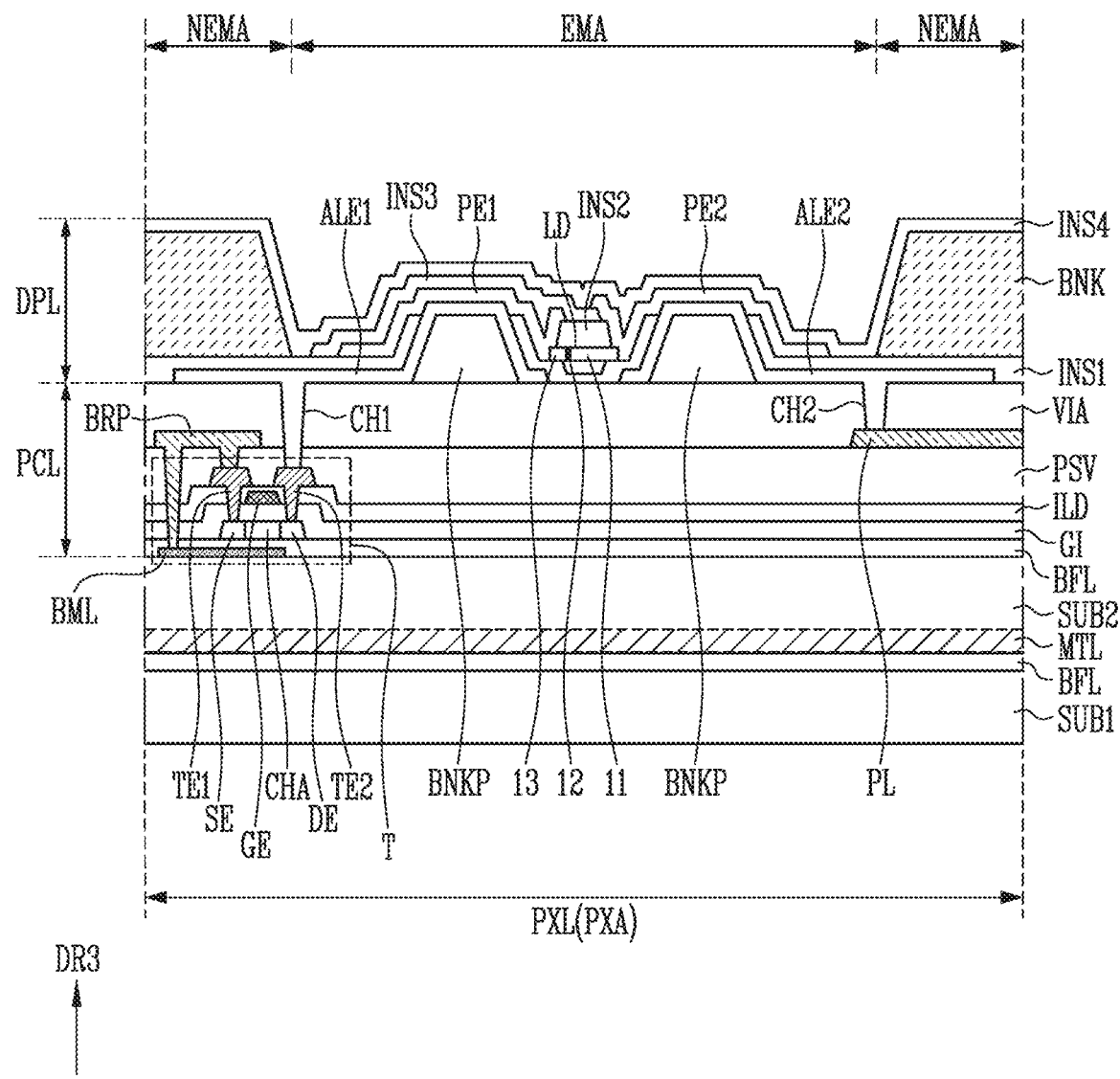

FIGS. 10A and 10B are sectional views illustrating one or more embodiments of the pixel included in the display panel shown in FIGS. 8A and 8B.

In FIGS. 10A and 10B, for convenience of illustration, one pixel PXL is simplified and illustrated, such that each electrode is illustrated as having a single layer (e.g., a single film), and each insulating layer is illustrated as having a single layer (e.g., a single film), but the present disclosure is not limited thereto, and any of the electrodes and layers may be provided as multi-layers as needed or desired.

Referring to FIGS. 8A, 8B, 10A, and 10B, the pixel PXL may include a pixel circuit layer PCL and a display element layer DPL, which are disposed on a second substrate SUB2. The first substrate SUB1, the heat conductive layer MTL, and the second substrate SUB2 have been described above with reference to FIGS. 8A and 8B, and therefore, redundant description thereof may not be repeated.

Circuit elements (e.g., transistors T) constituting a pixel circuit PXC of the pixel PXL, and signal lines (e.g., predetermined signal lines) connected to the circuit elements may be disposed at (e.g., in or on) a pixel area PXA where the corresponding pixel PXL is disposed. In addition, a light emitting element LD, and first and second pixel electrodes PE1 and PE2, which constitute a light emitting unit (e.g., a light emitting device) EMU of the corresponding pixel PXL, may be disposed at (e.g., in or on) the pixel area PXA. In an embodiment, the pixel area PXA may include an emission area EMA and a non-emission area NEMA.

The pixel circuit layer PCL may include at least one insulating layer, in addition to the circuit elements and the signal lines. For example, the pixel circuit layer PCL may include a buffer layer BFL, a gate insulating layer GI, an interlayer insulating layer ILD, a passivation layer PSV, and a via layer VIA, which are sequentially stacked along the third direction DR3 on the second substrate SUB2. Also, the pixel circuit layer PCL may include various conductive layers disposed between the above-described insulating layers.

The buffer layer BFL may be entirely disposed on the second substrate SUB2. The buffer layer BFL may prevent or substantially prevent an impurity from being diffused into a transistor T included in the pixel circuit PXC. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), and a metal oxide, such as aluminum oxide ($AlO_x$). The buffer layer BFL may be provided as a single layer, but may be provided as multi-layers including at least two layers. When the buffer layer BFL is provided as multi-layers, the layers may be formed of the same or substantially the same material as each other, or may be formed of different materials from one another. The buffer layer BFL may be omitted according to a material of the second substrate SUB2, a process condition, and/or the like. In some embodiments, as shown in FIG. 10B, the buffer layer BFL (e.g., an additional buffer layer) may also be disposed between the first substrate SUB1 and the heat conductive layer MTL.

The transistor T, a bridge pattern BRP, a lower line layer BML (e.g., a lower line or a lower electrode), and a power line (e.g., a predetermined power line) PL may be disposed on the buffer layer BFL.

The transistor T may include an active pattern (e.g., a semiconductor layer), and a gate electrode GE overlapping with a portion of the active pattern. The active pattern may include a channel region CHA, a first contact region SE, and a second contact region DE.

The active pattern may be configured with poly-silicon, amorphous silicon, an oxide semiconductor, or the like. Each of the channel region CHA, the first contact region SE, and the second contact region DE may be formed as a semiconductor layer doped or undoped with an impurity. In an example, each of the first contact region SE and the second contact region DE may be formed as a semiconductor layer doped with an impurity, and the channel region CHA may be formed as a semiconductor layer undoped with the impurity.

The channel region CHA of the transistor T may be one region of the active pattern overlapping with the gate electrode GE. The first contact region SE of the transistor T may be connected to (or in contact with) one end of the channel region CHA. The first contact region SE of the transistor T may be connected to a first connection member TE1 (e.g., a first conductive pattern). The second contact region DE of the transistor T may be connected to (or in contact with) the other end of the channel region CHA of the corresponding transistor T. Also, the second contact region DE of the transistor T may be connected to (or in contact with) a second connection member TE2 (e.g., a second conductive pattern).

The gate insulating layer GI may be entirely disposed on the active pattern and the buffer layer BFL. The gate insulating layer GI may be an inorganic insulating layer including an inorganic material. In an example, the gate insulating layer GI may include at least one of silicon nitride ($SiN_x$), silicon oxide ($SiO_x$), silicon oxynitride ($SiO_xN_y$), and a metal oxide, such as aluminum oxide ($AlO_x$). However, the material of the gate insulating layer GI is not limited to the examples above. In some embodiments, the gate insulating layer GI may be an organic insulating layer including an organic material. The gate insulating layer GI may be provided as a single layer, but may be provided as multi-layers including at least two layers.

The gate electrode GE may be disposed on the gate insulating layer GI. The gate electrode GE may be formed as a single layer including one selected from the group consisting of copper (Cu), molybdenum (Mo), tungsten (W), aluminum neodymium (AlNd), titanium (Ti), aluminum (Al), silver (Ag), and any suitable alloy thereof or a suitable mixture thereof, or may be formed in a double-layered or other suitable multi-layered structure, including molybdenum (Mo), titanium (Ti), copper (Cu), aluminum (Al), and/or silver (Ag), which is a low-resistance material that may decrease a wiring resistance.

The interlayer insulating layer ILD may be entirely disposed on the gate electrode GE and the gate insulating layer GI. The interlayer insulating layer ILD may include the same or substantially the same material as that of the gate insulating layer GI, or may include at least one material selected from the example materials described above constituting the gate insulating layer GI.

The first connection member TE1 may be disposed on the interlayer insulating layer ILD. The first connection member TE1 may be electrically and/or physically connected to the first contact region SE of the transistor T through a contact hole sequentially penetrating the interlayer insulating layer ILD and the gate insulating layer GI. In an embodiment, the first connection member TE1 connected to the first contact region SE of the transistor T may be electrically and/or physically connected to the bridge pattern BRP through a contact hole penetrating the passivation layer PSV located on the interlayer insulating layer ILD.

The first connection member TE1 may include the same or substantially the same material as that of the gate electrode GE, or may include at least one material selected from the example materials described above constituting the gate electrode GE.

The second connection member TE2 may be disposed on the interlayer insulating layer ILD. The second connection member TE2 may be electrically and/or physically connected to the second contact region DE of the transistor T through a contact hole penetrating the interlayer insulating layer ILD and the gate insulating layer GI.

In the present embodiment, a case where the transistor T is a thin film transistor having a top gate structure has been described as an example. However, the present disclosure is not limited thereto, and the structure of the transistor T may be variously modified as needed or desired.

The bridge pattern BRP may be disposed on the passivation layer PSV. The bridge pattern BRP may be connected to the first contact region SE of the transistor T through the first connection member TE1. Also, the bridge pattern BRP may be electrically and/or physically connected to the lower line layer BML through a contact hole sequentially penetrating the passivation layer PSV, the interlayer insulating layer ILD, the gate insulating layer GI, and the buffer layer BFL. The lower line layer BML and the first contact region SE of the transistor T may be electrically connected to each other through the bridge pattern BRP and the first connection member TE1.

The lower line layer BML may be a first conductive layer from among the conductive layers provided on the second substrate SUB2. The lower line layer BML may be disposed between the buffer layer BFL and second substrate SUB2. The lower line layer BML may be electrically connected to the transistor T, to widen the driving range of a voltage (e.g., a predetermined voltage) supplied to the gate electrode GE of the transistor T. In an example, the lower line layer BML may be electrically connected to the first contact region SE of the transistor T to stabilize the channel region CHA of the transistor T. In addition, because the lower line layer BML is electrically connected to the first contact region SE of the transistor T, floating of the lower line layer BML may be prevented or substantially prevented.

The power line PL may be disposed on the passivation layer PSV. The power line PL may be provided at (e.g., in or on) the same layer as that of the bridge pattern BRP. However, the present disclosure is not limited thereto, and the position of the power line PL in the pixel circuit layer PCL may be variously modified as needed or desired. The voltage of a driving power source may be applied to the power line PL. The power line PL may include a conductive material (or substance). In an example, the power line PL may be formed as a single layer (e.g., a single film) including one selected from the group consisting of copper (Cu), molybdenum (Mo), tungsten (W), aluminum neodymium (AlNd), titanium (Ti), aluminum (Al), silver (Ag), and any suitable alloy thereof or a suitable mixture thereof, or may be formed in a double-layered (e.g., a double-film) structure or other suitable multi-layered (e.g., a multi-film) structure, including molybdenum (Mo), titanium (Ti), copper (Cu), aluminum (Al), and/or silver (Ag), which is a low-resistance material that may decrease a wiring resistance. In an example, the power line PL may be configured as double layers (or a double film) in which titanium (Ti)/copper (Cu) are sequentially stacked.

The via layer VIA may be disposed over the bridge pattern BRP and the power line PL.

The via layer VIA may include an organic insulating layer, an inorganic insulating layer, or the organic insulating layer disposed on the inorganic insulating layer. The inorganic insulating layer may include, for example, at least one of silicon oxide ($SiO_x$), silicon nitride ($SiN_x$), silicon oxynitride ($SiO_xN_y$), and a metal oxide, such as aluminum oxide ($AlO_x$). The organic insulating layer may include, for example, at least one of acrylic resin, epoxy resin, phenolic resin, polyamide resin, polyimide resin, unsaturated polyester resin, poly-phenylene ether resin, poly-phenylene sulfide resin, and benzocyclobutene resin.

The via layer VIA may include a first contact hole CH1 corresponding to a contact hole of the passivation layer PSV, through which the second connection member TE2 electrically connected to the transistor T is exposed. Also, the via layer VIA may include a second contact hole CH2 through which a portion of the power line PL is exposed.

The display element layer DPL may be disposed on the via layer VIA (or the pixel circuit layer PCL).

The display element layer DPL may include a bank pattern BNKP, a bank BNK, first and second alignment electrodes ALE1 and ALE2, the light emitting element LD, the first and second pixel electrodes PE1 and PE2, and insulating layers INS1 to INS4.

The bank pattern BNKP may be disposed on the via layer VIA, and be located at (e.g., in or on) the emission area EMA where light is emitted in the pixel PXL. The bank pattern BNKP may support each of the first and second alignment electrodes ALE1 and ALE2 to change a surface profile (or shape) of each of the first and second alignment electrodes ALE1 and ALE2, such that light emitted from the light emitting element LD is guided in the third direction DR3 (e.g., or an image display direction of the display panel DP). The bank pattern BNKP may be an inorganic insulating layer including an inorganic material, or an organic insulating layer including an organic material. In some embodiments, the bank pattern BNKP may include a single-layer organic insulating layer and/or a single-layer inorganic insulating layer, but the present disclosure is not limited thereto. In some embodiments, the bank pattern BNKP may be provided in multi-layers in which at least one organic insulating layer and at least one inorganic insulating layer are stacked on one another. However, the material of the bank pattern BNKP is not limited to the above-described examples. In some embodiments, the bank pattern BNKP may include a conductive material.

Each of the first and second alignment electrodes ALE1 and ALE2 may be disposed over the bank pattern BNKP to have a surface profile corresponding to the shape of the bank pattern BNKP. Each of the first and second alignment electrodes ALE1 and ALE2 may be made of a material having a constant or substantially constant reflectivity to guide light emitted from the light emitting element LD in the image display direction of the display panel DP (or the display device DD). In an example, each of the first alignment electrode ALE1 and the second alignment electrode ALE2 may be configured with a conductive material (or substance) having a constant or substantially constant reflectivity. The conductive material (or substance) may include an opaque metal for reflecting light emitted from the light emitting element LD in the image display direction of the display panel DP (or the display device DD). The opaque metal may include, for example, one or more various metals such as silver (Ag), magnesium (Mg), aluminium (Al), platinum (Pt), palladium (Pd), gold (Au), nickel (Ni), neodymium (Nd), iridium (Ir), chromium (Cr), titanium (Ti), and/or any suitable alloys thereof. In some embodiments, each of the first alignment electrode ALE1 and the second alignment electrode ALE2 may include a transparent conductive material (or substance). When each of the first alignment electrode ALE1 and the second alignment electrode ALE2 includes a transparent conductive material (or substance), a separated conductive layer may be added, which is made of an opaque metal for reflecting light emitted from the light emitting element LD in the third direction DR3. However, the material of the first alignment electrode ALE1 and the second alignment electrode ALE2 is not limited to the above-described materials.

The first alignment electrode ALE1 may be electrically connected to the transistor T through the first contact hole CH1 penetrating the via layer VIA and the passivation layer PSV, and the second connection member TE2. The second alignment electrode ALE2 may be electrically connected to the power line PL through the second contact hole CH2 penetrating the via layer VIA.

A first insulating layer INS1 may be disposed over the first and second alignment electrodes ALE1 and ALE2. The first insulating layer INS1 may fill a space between the light emitting light LD and the via layer VIA, to stably support the light emitting element LD. The first insulating layer INS1 may include an inorganic insulating layer made of an inorganic material, or an organic insulating layer made of an organic material. The first insulating layer INS1 may be partially opened (e.g., may including an opening) to expose each of a portion of the first alignment electrode ALE1 and a portion of the second alignment electrode ALE2.

The bank BNK may be disposed on the first insulating layer INS1. The bank BNK may surround (e.g., around a periphery of) at least one side of a peripheral area (e.g., the non-emission area NEMA where light is not emitted) of the pixel PXL. The bank BNK may be a pixel defining layer and/or a dam structure, which defines the emission area EMA where the light emitting element LD is to be supplied, in a process of supplying the light emitting element LD to the pixel PXL. In an example, the emission area EMA of the pixel PXL is partitioned by the bank BNK, so that a mixed liquid (e.g., ink) including a desired amount and/or a desired kind of light emitting element LD may be supplied (or input) to the emission area EMA.

The bank BNK includes at least one light blocking material and/or at least one reflective material, to prevent or substantially prevent a light leakage defect in which light (or a beam) is leaked between the pixel PXL and the pixels PXL adjacent thereto. In some embodiments, the bank BNK may include a transparent material (or substance). In an example, the transparent material may include polyamide resin, polyimide resin, and/or the like, but the present disclosure is not limited thereto. In another embodiment, a reflective material layer may be separately provided and/or formed on the bank BNK, so as to further improve the efficiency of light emitted from the pixel PXL.

The light emitting element LD may be disposed on the first insulating layer INS1. Also, the light emitting element LD may be disposed between the first alignment electrode ALE1 and the second alignment electrode ALE2, and may be electrically connected to each of the first and second alignment electrodes ALE1 and ALE2. The light emitting element LD may emit any one of colored light and/or white light. The light emitting element LD is provided in a form in which the light emitting element LD is dispersed in a mixed liquid to be input to the pixel PXL. The light emitting element LD may include a light emitting stack pattern, in which a first semiconductor layer 11, an active layer 12, and a second semiconductor layer 13 are sequentially stacked along one direction. Also, in some embodiments, the light emitting element LD may include an insulative film surrounding (e.g., around a periphery of) an outer circumferential surface of the light emitting stack pattern.

The light emitting element LD may be provided in various suitable shapes. In an example, the light emitting element LD may have a rod-like shape, a bar-like shape, a pillar-like shape, or the like, which is longer in its length direction (e.g., an aspect ratio thereof is greater than 1). In another example, the light emitting element LD may have a rod-like shape, a bar-like shape, a pillar-like shape, or the like, which is shorter in its length direction (e.g., the aspect ratio thereof is smaller than 1). In another example, the light emitting element LD may have a rod-like shape, a bar-like shape, a pillar-like shape, or the like, of which the aspect ratio thereof is equal to or substantially equal to 1.

The light emitting element LD may include, for example, a light emitting diode (LED) manufactured small enough to have a diameter and/or a length to a degree of a nano scale (e.g., a nanometer) to a micrometer scale (e.g., a micrometer).

The first semiconductor layer 11 may include, for example, at least one n-type semiconductor layer. For example, the first semiconductor layer 11 may include any one semiconductor material from among InAlGaN, GaN, AlGaN, InGaN, AlN, and InN, and may include an n-type semiconductor layer doped with a first conductive dopant (or n-type dopant), such as Si, Ge, or Sn.

The active layer 12 is disposed between the first semiconductor layer 11 and the second semiconductor layer 13, and may be formed in a single or multiple quantum well structure. In an example, when the active layer 12 is formed in the multiple quantum well structure, a barrier layer, a strain reinforcing layer, and a well layer, which constitute one unit, may be periodically and repeatedly stacked in the active layer 12. The strain reinforcing layer may have a lattice constant smaller than that of the barrier layer, to further reinforce strain (e.g., such as compressive strain) applied to the well layer. However, the structure of the active layer 12 is not limited to the above-described example.

The active layer 12 may emit light having a wavelength of 400 nm to 900 nm, and may use a double hetero structure. In an embodiment, a clad layer doped with a conductive dopant may be formed on/between the active layer 12 and the first and second semiconductor layers 11 and 13 along the length direction of the light emitting element LD. In an example, the clad layer may be formed as an AlGaN layer or an InAlGaN layer.

The second semiconductor layer 13 may include a semiconductor layer having a type different from the type of the first semiconductor layer 11. In an example, the second semiconductor layer 13 may include at least one p-type semiconductor material. For example, the second semiconductor layer 13 may include at least one semiconductor material from among InAlGaN, GaN, AlGaN, InGaN, AlN, and InN, and may include a p-type semiconductor layer doped with a second conductive dopant (or p-type dopant), such as Mg, Zn, Ca, Sr, or Ba.

Light emitting elements LD may be mixed in a volatile solvent to be input (or supplied) to the pixel area PXA through an inkjet printing process or a slit coating process. When an alignment signal corresponding to each of the first alignment electrode ALE1 and the second alignment electrode ALE2 is provided, an electric field may be formed between the first alignment electrode ALE1 and the second alignment electrode ALE2. Therefore, the light emitting elements LD may be aligned between the first alignment electrode ALE1 and the second alignment electrode ALE2.

A second insulating layer INS2 may be disposed on the light emitting element LD. The second insulating layer INS2 may cover a portion of a top surface of the light emitting element LD, and may expose opposite end portions of the light emitting element LD to the outside. The second insulating layer INS2 may further fix the light emitting element LD.

The first pixel electrode PE1 and the second pixel electrode PE2 may be disposed to be spaced apart from each other on the second insulating layer INS2 on the light emitting element LD.

The first pixel electrode PE1 may be formed on the first alignment electrode ALE1 and one end portion of the light emitting element LD to be electrically connected to the one end portion of the light emitting element LD. The first pixel electrode PE1 may be electrically and/or physically connected to the first alignment electrode ALE1, while being in direct contact with the first alignment electrode ALE1 exposed as a portion of the first insulating layer INS1 is removed. However, the present disclosure is not limited thereto. In an embodiment, the first pixel electrode PE1 may be an anode.

The second pixel electrode PE2 may be formed on the second alignment electrode ALE2 and the other end portion of the light emitting element LD to be electrically connected to the other end portion of the light emitting element LD. The second pixel electrode PE2 may be electrically and/or physically connected to the second alignment electrode ALE2, while being in contact with the second alignment electrode ALE2 exposed as another portion of the first insulating layer INS1 is removed. However, the present disclosure is not limited thereto. In an embodiment, the second pixel electrode PE2 may be a cathode.

The first pixel electrode PE1 and the second pixel electrode PE2 may be configured with various suitable transparent conductive materials, such that light emitted from the light emitting element LD advances in the image display direction of the display device DD without loss or substantially loss.

In an embodiment, the first pixel electrode PE1 and the second pixel electrode PE2 may be provided at (e.g., in or on) different layers from each other. The third insulating INS3 may be disposed between the first pixel electrode PE1 and the second pixel electrode PE2. The third insulating layer INS3 may be provided over the first pixel electrode PE1 to cover the first pixel electrode PE1 (e.g., or to allow the first pixel electrode PE1 not to be exposed to the outside), thereby preventing or substantially preventing corrosion of the first pixel electrode PE1 and/or the like. The third insulating layer INS3 may include an inorganic insulating layer made of an inorganic material, or an organic insulating layer made of an organic material.

A fourth insulating layer INS4 may be disposed over the first pixel electrode PE1 and the second pixel electrode PE2. The fourth insulating layer INS4 may be an inorganic layer (or inorganic insulating layer) including an inorganic material, or an organic layer (or organic insulating layer) including an organic material. In an example, the fourth insulating layer INS4 may have a structure in which at least one inorganic layer and at least one organic layer are alternately stacked. The fourth insulating layer INS4 may entirely cover the display element layer DPL, thereby blocking external moisture, external humidity, and/or the like from being introduced into the display element layer DPL including the light emitting elements LD. In some embodiments, the fourth insulating layer INS4 may be omitted as needed or desired.

Figure 11A:
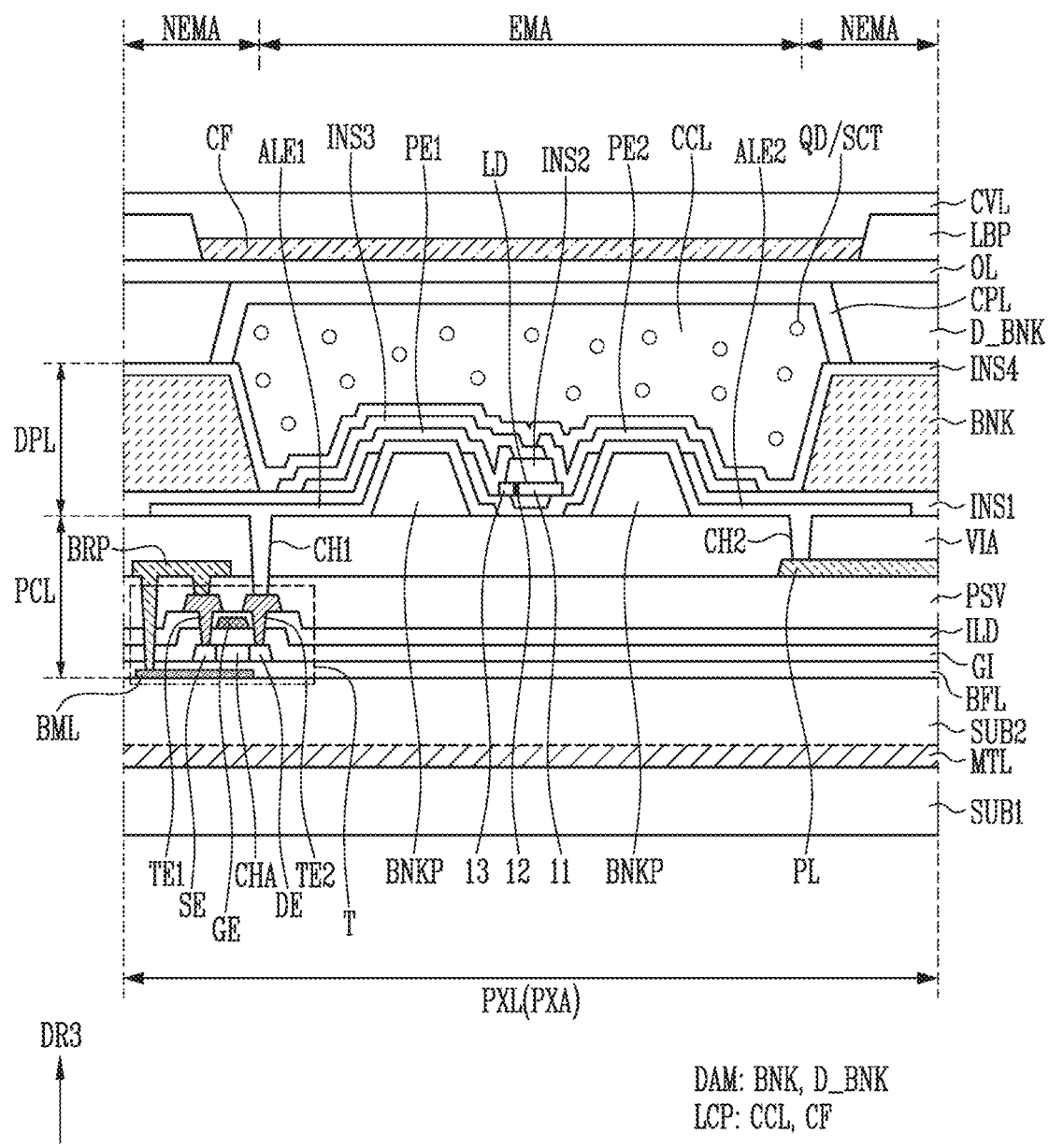
FIGS. 11A-11B are sectional views illustrating one or more other embodiments of the pixel included in the display panel shown in FIGS. 8A and 8B.
Figure 11B:
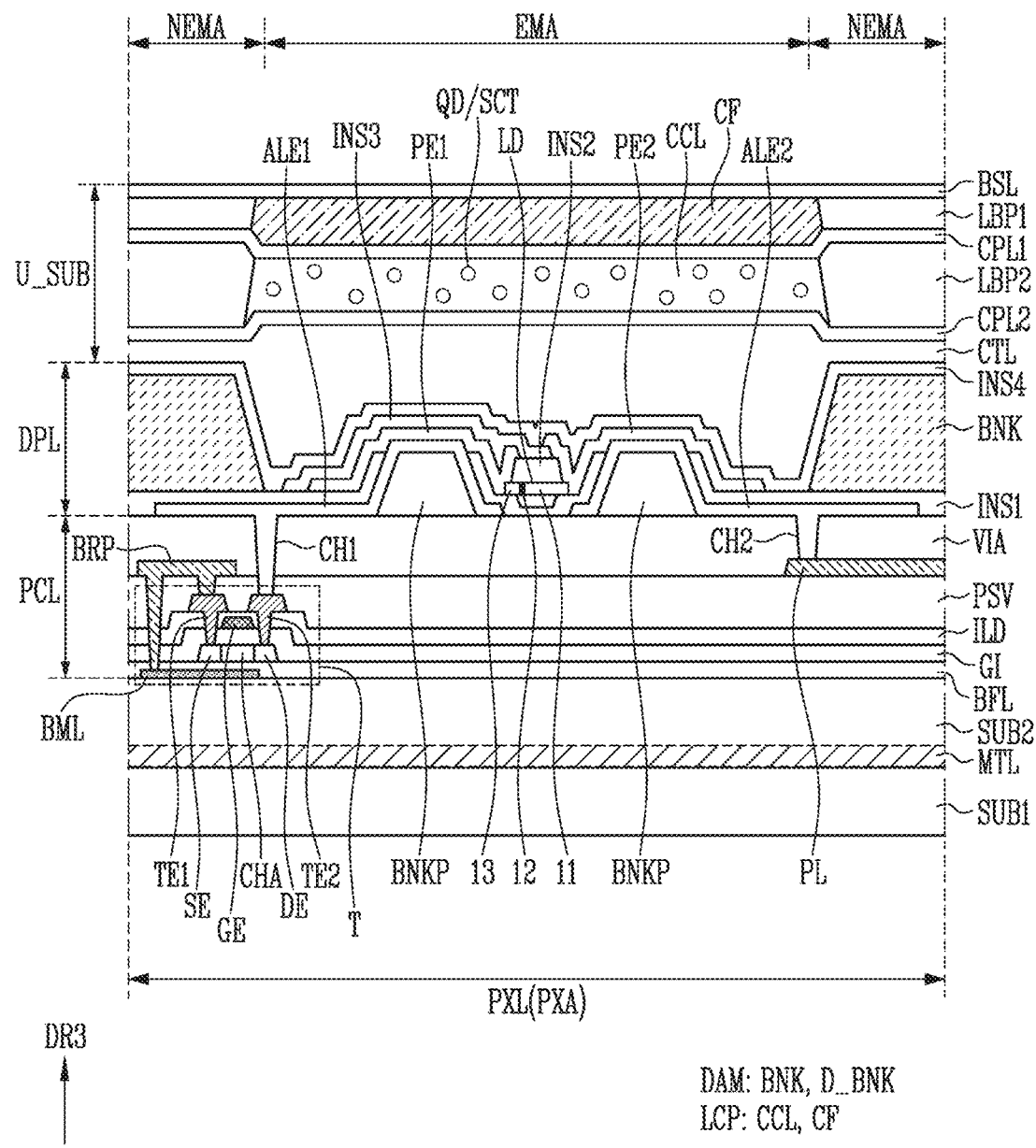

FIGS. 11A and 11B are sectional views illustrating one or more other embodiments of the pixel included in the display panel shown in FIGS. 8A and 8B. In FIGS. 11A and 11B, a section of a pixel PXL corresponding to that shown in FIG. 10A are illustrated. FIG. 11B illustrates a modified example of the pixel PXL shown in FIG. 11A in relation to a position of a color conversion layer CCL. For example, an embodiment in which the color conversion layer CCL is located on a top of the display element layer DPL through a continuous process is shown in FIG. 11A, and an embodiment in which an upper substrate U_SUB including the color conversion layer CCL is located on the display element layer DPL through an adhesion process using an intermediate layer CTL is shown in FIG. 11B. In relation to the embodiments shown in FIGS. 11A and 11B, portions different from those of the above-described embodiments (e.g., the embodiment shown in FIG. 10A) may be mainly described, and redundant description therebetween may not be repeated.

Referring to FIGS. 8A, 8B, 10A, 10B, and 11A, a dummy bank D_BNK and the color conversion layer CCL may be provided and/or formed on the fourth insulating layer INS4.

The dummy bank D_BNK may be located on the fourth insulating layer INS4 over the bank BNK. Therefore, the dummy bank D_BNK along with the bank BNK may implement a dam part DAM (e.g., a dam structure). The dam part DAM may be a structure that defines (e.g., that finally defines) the emission area EMA where light is emitted in the pixel PXL. In an embodiment, the dam part DAM may be a structure that defines the emission area EMA to which the color conversion layer CCL is to be supplied. In an example, the emission area EMA of the pixel PXL may be partitioned (e.g., may be finally partitioned) by the dam part DAM, so that a desired amount and/or a desired kind of color conversion layer CCL may be supplied (or input) to the emission area EMA.

The dummy bank D_BNK may include a light blocking material. In an example, the dummy bank D_BNK may be a black matrix. In some embodiments, the dummy bank D_BNK may be configured to include at least one light blocking material and/or at least one reflective material. Thus, the dummy bank D_BNK allows light emitted from the light emitting elements LD to further advance in the image display direction of the display device DD (e.g., in the third direction DR3), thereby improving light emission efficiency of the light emitting elements LD.

The color conversion layer CCL may be located on the fourth insulating layer INS4. The color conversion layer CCL may be located at (e.g., in or on) the emission area EMA of the pixel area PXA.

The color conversion layer CCL may include color conversion particles QD corresponding to a desired color (e.g., a specific or predetermined color). In an example, the color conversion layer CCL may include color conversion particles QD for converting light of a first color (e.g., a first wavelength band), which is emitted from light emitting elements LD, into light of a second color (e.g., a second wavelength band different from the first wavelength band). When the pixel PXL is a red pixel (or a red sub-pixel), the color conversion layer CCL may include color conversion particles QD of a red quantum dot, which convert light of the first color emitted from the light emitting elements LD into red light (e.g., light of the second color). When the pixel PXL is a green pixel (or a green sub-pixel), the color conversion layer CCL may include color conversion particles QD of a green quantum dot, which convert light of the first color emitted from the light emitting elements LD into green light (e.g., light of the second color). When the pixel PXL is a blue pixel (or a blue sub-pixel), the color conversion layer CCL may include color conversion particles QD of a blue quantum dot, which convert light of the first color emitted from the light emitting elements LD into blue light (e.g., light of the second color). In some embodiments, when the pixel PXL is the blue pixel (or the blue sub-pixel), a light scattering layer including light scattering particles SCT may be provided, instead of the color conversion layer CCL including the color conversion particles QD. In an example, when the light emitting elements LD emit blue light, the pixel PXL may include the light scattering layer including the light scattering particles SCT. The above-described light scattering layer may be omitted in some embodiments, as needed or desired. In other embodiments, when the pixel PXL is the blue pixel (or the blue sub-pixel), transparent polymer may be provided, instead of the color conversion layer CCL.

A capping layer CPL may be provided and/or formed over the color conversion layer CCL and on (e.g., a side of) the dummy bank D_BNK. In some embodiments, the capping layer CPL may be provided and/or formed over both the color conversion layer CCL and the dummy bank D_BNK.

The capping layer CPL may be entirely (or wholly) located at (e.g., in or on) the pixel area PXA, and be directly disposed on (e.g., the side of) the dummy bank D_BNK and over the color conversion layer CCL. In some embodiments, the capping layer CPL may be directly disposed over both the dummy bank D_BNK and the color conversion layer CCL. The capping layer CPL may be an inorganic layer (or inorganic insulating layer) including an inorganic material. The capping layer CPL may include at least one of silicon nitride ($SiN_x$), silicon oxide ($SiO_x$), silicon oxynitride ($SiO_xN_y$), and a metal oxide, such as aluminum oxide ($AlO_x$). The capping layer CPL covers the color conversion layer CCL, while being located over the color conversion layer CCL, to protect the color conversion layer CCL.

An organic layer OL may be provided and/or formed on the capping layer CPL. The organic layer OL may reduce a step difference occurring due to components disposed on the bottom thereof, and provide a flat or substantially flat surface on the top thereof. The organic layer OL may be entirely disposed on the second substrate SUB2. The organic layer OL may be a common layer that is commonly provided at (e.g., in or on) the display area DA including the pixel area PXA, but the present disclosure is not limited thereto.

The organic layer OL may include an organic material, such as acrylic resin, epoxy resin, phenolic resin, polyamides resin, polyimides resin, polyester resin, poly-phenylene sulfide resin, or benzocyclobutene (BCB), but the present disclosure is not limited thereto.

A color filter CF and a light blocking pattern LBP may be provided and/or formed on the organic layer OL.

The color filter CF may allow light of a desired color (e.g., a specific or predetermined color) to be selectively transmitted therethrough. The color filter CF along with the color conversion layer CCL may constitute a light conversion pattern LCP. The color filter CF may include a color filter material, which allows light of the desired color converted in the color conversion layer CCL to be selectively transmitted therethrough. The color filter CF may include a red color filter, a green color filter, and a blue color filter. The above-described color filter CF may be provided on one surface of the capping layer CPL to correspond to the color conversion layer CCL.

The light conversion pattern LCP including the color conversion layer CCL and the color filter CF may correspond to the emission area EMA of the pixel PXL.

The light blocking pattern LBP may be disposed on the one surface of the organic layer OL adjacent to the color filter CF. In an example, the light blocking pattern LBP may be located on the one surface of the organic layer OL to correspond to the non-emission area NEMA of the pixel area PXA. The light blocking pattern LBP may correspond to the dam part DAM. The light blocking pattern LBP may include a light blocking material, which prevents or substantially prevents a light leakage defect in which light (or a beam) is leaked between the pixel PXL and pixels PXL adjacent thereto. In an example, the light blocking pattern LBP may include a black matrix. The light blocking pattern LBP may prevent or substantially prevent color mixture of light emitted from adjacent pixels PXL.

The light blocking pattern LBP may be provided in the form of multi-layers (or a multi-film), in which at least two color filters that allow light of different colors from each other to be selectively transmitted therethrough are overlapped with each other. In an example, the light blocking pattern LBP may be provided in a form including a red color filter, a green color filter overlapping with the red color filter while being located on the red color filter, and a blue color filter overlapping with the green color filter while being located on the green color filter. In other words, the light blocking pattern LBP may be provided in the form of a structure in which a red color filter, a green color filter, and a blue color filter are sequentially stacked. The red color filter, the green color filter, and the blue color filter at (e.g., in or on) the non-emission area NEMA of the pixel area PXA may be used as the light blocking pattern LBP that blocks transmission of light.

A cover layer CVL may be provided and/or formed over the light blocking pattern LBP and the color filter CF. Similar to the organic layer OL, the cover layer CVL may include an organic material, but the present disclosure is not limited thereto.

In the display device DD in accordance with the present embodiment, the light conversion pattern LCP is disposed over the light emitting element LD, so that light having excellent color reproducibility is emitted through the light conversion pattern LCP, thereby improving light emission efficiency.

Although it is described that the color conversion layer CCL is directly formed on the fourth insulating layer INS4, the present disclosure is not limited thereto. In some embodiments, the color conversion layer CCL may be formed on a separate substrate (e.g., the upper substrate U_SUB as shown in FIG. 11B) to be coupled to (e.g., connected to or attached to) the display element layer DPL through the intermediate layer CTL or the like.

Referring to FIG. 11B, the intermediate layer CTL may be a transparent adhesive layer (or cohesive layer), such as an optically clear adhesive for reinforcing adhesion between the display element layer DPL and the upper substrate U_SUB, but the present disclosure is not limited thereto. In some embodiments, the intermediate layer CTL may be a refractive index conversion layer for converting the refractive index of light emitted from the light emitting elements LD and then advancing toward the upper substrate U_SUB, thereby improving the light emission luminance of the pixel PXL. In some embodiments, the intermediate layer CTL may include a filler configured with an insulating material having insulating and adhesive properties.

The upper substrate U_SUB may constitute an encapsulation substrate and/or a window member of the display device DD. The upper substrate U_SUB may include a third substrate BSL (e.g., a third base layer), a color conversion layer CCL, a color filter CF, first and second light blocking patterns LBP1 and LBP2, and first and second capping layers CPL1 and CPL2.

The third substrate BSL may be a flexible substrate, and the material or property of the third substrate BSL is not particularly limited. The third substrate BSL may be configured with the same or substantially the same material as those of the first and second substrates SUB1 and SUB2, but the present disclosure is not limited thereto.

In FIG. 11B, the color conversion layer CCL and the color filter CF may be disposed on the one surface of the third substrate BSL to face the display element layer DPL. The color filter CF may be provided on the one surface of the third substrate BSL to correspond to the color conversion layer CCL.

The first capping layer CPL1 may be provided and/or formed between the color filter CF and the color conversion layer CCL.

The first capping layer CPL1 may be located on one surface of the color filter CF to cover the color filter CF, thereby protecting the color filter CF. The first capping layer CPL1 may be an inorganic layer including an inorganic material, or an organic layer including an organic material.

The light blocking patterns LBP1 and LBP2 may be located adjacent to the color conversion layer CCL and the color filter CF. The light blocking patterns LBP1 and LBP2 may be disposed on the one surface of the third substrate BSL to correspond to the non-emission area NEMA of the pixel PXL. The light blocking patterns LBP1 and LBP2 may include the first light blocking pattern LBP1 and the second light blocking pattern LBP2.

The first light blocking pattern LBP1 may be located on the one surface of the third substrate BSL to be located adjacent to the color filter CF.

The first capping layer CPL1 may be disposed on the first light blocking pattern LBP1.

The second light blocking pattern LBP2 may be disposed on one surface of the first capping layer CPL1 to correspond to the first light blocking pattern LBP1. The second light blocking pattern LBP2 may be a black matrix. The first light blocking pattern LBP1 and the second light blocking pattern LBP2 may include the same or substantially the same material as each other. In an embodiment, the second light blocking pattern LBP2 may be a structure finally defining the emission area EMA of the pixel PXL. The second light blocking pattern LBP2 may be a dam structure finally defining the emission area EMA in which the color conversion layer CCL is to be supplied in a process of supplying the color conversion layer CCL.

The second capping layer CPL2 may be entirely provided and/or formed on the color conversion layer CCL and the second light blocking pattern LBP2.

The second capping layer CPL2 may include at least one of silicon nitride ($SiN_x$), silicon oxide ($SiO_x$), silicon oxynitride ($SiO_xN_y$), and a metal oxide, such as aluminum oxide ($AlO_x$), but the present disclosure is not limited thereto. In some embodiments, the second capping layer CPL2 may be configured as an organic layer including an organic material. The second capping layer CPL2 is located on the color conversion layer CCL, thereby protecting the color conversion layer CCL from external moisture, humidity, and/or the like. Accordingly, the reliability of the color conversion layer CCL can be further improved.

Figure 12:
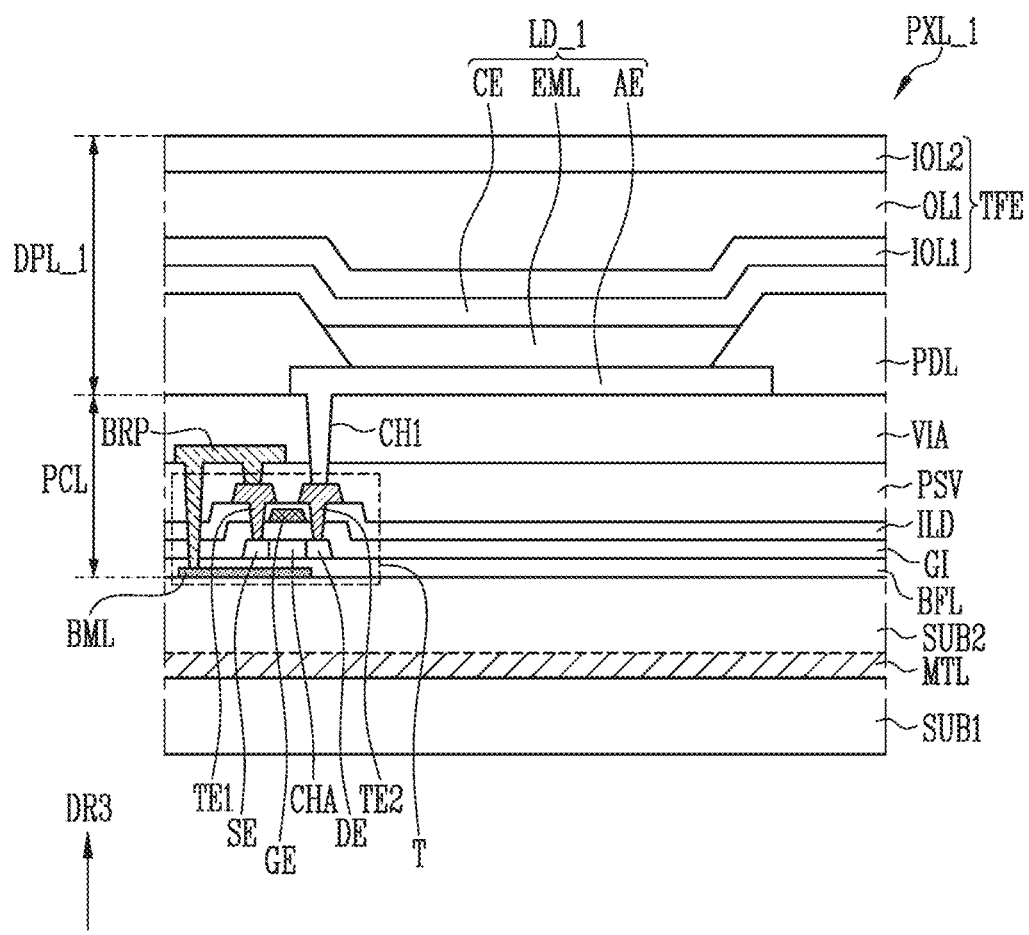
FIG. 12 is a sectional view schematically illustrating another embodiment of the pixel included in the display panel shown in FIGS. 8A and 8B.

FIG. 12 is a sectional view schematically illustrating another embodiment of the pixel included in the display panel shown in FIGS. 8A and 8B.

Referring to FIGS. 8A, 8B, and 12, a pixel PXL_1 may include a pixel circuit layer PCL and a display element layer DPL_1, which are disposed on a second substrate SUB2. Except for the display element layer DPL_1, the pixel PXL_1 shown in FIG. 12 may be the same or substantially the same as (or similar to) the pixel PXL shown in FIG. 10A, and therefore, redundant description thereof may not be repeated.

The display element layer DPL_1 may include a pixel defining layer PDL and a light emitting element LD_1. The light emitting element LD_1 may include a first electrode AE, an emitting layer EML, and a second electrode CE. For example, the light emitting element LD_1 may be an organic light emitting diode.

The first electrode AE may be disposed on a passivation layer PSV. The first electrode AE may be electrically connected to a transistor T through a first contact hole CH1 penetrating the passivation layer PSV (and the via layer VIA).

The pixel defining layer PDL may include an opening, and at least a portion of the first electrode AE may be exposed by the opening. In some embodiments, the pixel defining layer PDL may be omitted as needed or desired. The pixel defining layer PDL may include an organic material.

The emitting layer EML may be disposed on the first electrode AE, and the second electrode CE may be disposed on the emitting layer EML.

One of the first electrode AE and the second electrode CE may be an anode electrode, and the other of the first electrode AE and the second electrode CE may be a cathode electrode. For example, the first electrode AE may be an anode electrode, and the second electrode CE may be a cathode electrode.

At least one of the first electrode AE and the second electrode CE may be a transmissive electrode. For example, when the display device is a top emission display device, the first electrode AE may be a reflective electrode, and the second electrode CE may be a transmissive electrode.

The emitting layer EML may be disposed on a surface of the first electrode AE, which is exposed by the pixel defining layer PDL. The emitting layer EML may have a multi-layered thin film structure including at least a light generation layer. The emitting layer EML may include a hole injection layer for injecting holes, a hole transport layer, which is excellent in transportability of holes, for increasing a hole recombination opportunity by suppressing movement of electrons, which are not recombined in a light generation layer, the light generation layer for emitting light by recombination of the injected electrons and holes, a hole blocking layer for suppressing the movement of the holes that are not recombined in the light generation layer, an electron transport layer for smoothly transporting the electrons to the light generation layer, and an electron injection layer for injecting the electrons.

The hole injection layer, the hole transport layer, the hole blocking layer, the electron transport layer, and the electron injection layer may be a common layer, in which the hole injection layer, the hole transport layer, the hole blocking layer, the electron transport layer, and the electron injection layer are connected to one another in adjacent pixel areas.

The second electrode CE may be disposed on the emitting layer EML. The second electrode CE may be a semi-transmissive reflective layer. For example, the second electrode CE may be a thin metal layer having a thickness to a degree to which the second electrode CE enables light to be transmitted therethrough. The second electrode CE may allow a portion of light generated in the light generation layer to be transmitted therethrough, and may reflect other portions of the light generated in the light generation layer.

A portion of light emitted from the emitting layer EML is not transmitted through the second electrode CE, and light reflected from the second electrode CE may again be reflected from the first electrode AE. In other words, light emitted from the emitting layer EML may resonate between the first electrode AE and the second electrode CE. The light emission efficiency of the light emitting element LD_1 may be improved by the resonance of the light.

The display element layer DPL_1 may further include a thin film encapsulation layer TFE.

The thin film encapsulation layer TFE may be disposed on the second electrode CE. The thin film encapsulation layer TFE may be commonly disposed in the pixels PXL_1. The thin film encapsulation layer TFE may directly cover the second electrode CE.

The thin film encapsulation layer TFE may include a first encapsulation inorganic layer IOL1, a first encapsulation organic layer OL1, and a second encapsulation inorganic layer IOL2, which are sequentially stacked on the second electrode CE. An encapsulation inorganic layer may be made of an inorganic insulating material, such as polysiloxane, silicon nitride, silicon oxide, and/or silicon oxynitride. An encapsulation organic layer may be made of an organic insulating material, such as a polyacryl-based compound, a polyimide-based compound, a fluorine-based compound such as Teflon, or a benzocyclobutene-based compound.

In some embodiments, the embodiments shown in FIGS. 11A and 11B may be applied to the pixel PXL_1 shown in FIG. 12. For example, the pixel PXL_1 shown in FIG. 12 may further include the upper substrate U_SUB (e.g., the color conversion layer CCL and the color filter CF) disposed on the thin film encapsulation layer TFE.

Figure 13:
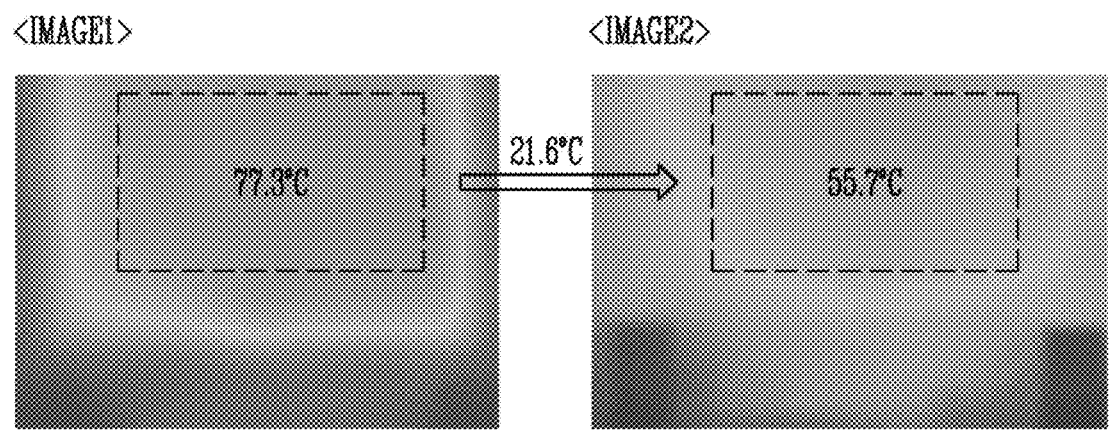
FIG. 13 is a view illustrating an image obtained by photographing the display device.

FIG. 13 is a view illustrating an image obtained by photographing the display device.

Referring to FIGS. 5A and 13, a first image IMAGE1 is obtained by infrared-photographing a display device in accordance with a comparative embodiment, which does not include the heat pipe HP (and the heat conductive layer MTL (e.g., see FIG. 8A)), and a second image IMAGE2 is obtained by infrared-photographing the display device DD shown in FIG. 5A. The display devices of the first and second images IMAGE1 and IMAGE2 are displaying the same image (e.g., a full-white image) as each other.

Referring to the first image IMAGE1, a temperature of a display area (e.g., a dotted area) of the display device in accordance with the comparative embodiment may be about 77.3° C. Referring to the second image IMAGE2, a temperature of the display area of the display device DD shown in FIG. 5A may be about 55.7° C., which may be lower by about 21.6° C. as compared with the display device in accordance with the comparative embodiment. In addition, the temperature of the display area of the display deice DD shown in FIG. 5A is entirely uniform or substantially uniform, and a temperature at an outer portion of the display device DD may also be represented entirely uniformly or substantially uniformly.

In other words, it is shown that heat generation of the display device DD is reduced (or minimized) by the heat pipe HP (and the heat conductive layer MTL (e.g., see FIG. 8A)), which are included in the display device DD shown in FIG. 5A.

A degree to which the heat generation is minimized or reduced may vary according to a kind of the heat pipe HP (e.g., a mesh type or a groove type). For example, the heat pipe HP having the groove type may have an improved effect over that of the heat pipe HP having the mesh type, and the heat pipe HP having an appropriate type may be applied to the display device DD by considering design specifications and/or the like of the display device DD.

Figure 14:
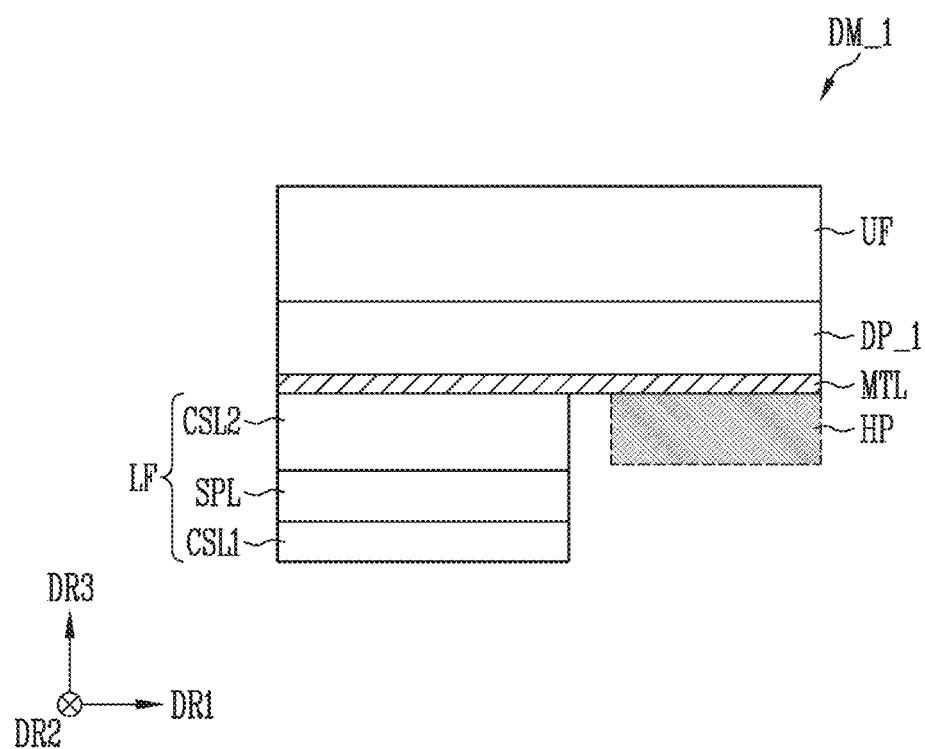
FIG. 14 is a sectional view illustrating another embodiment of the display module included in the display device shown in FIGS. 6A and 6B.
Figure 15:
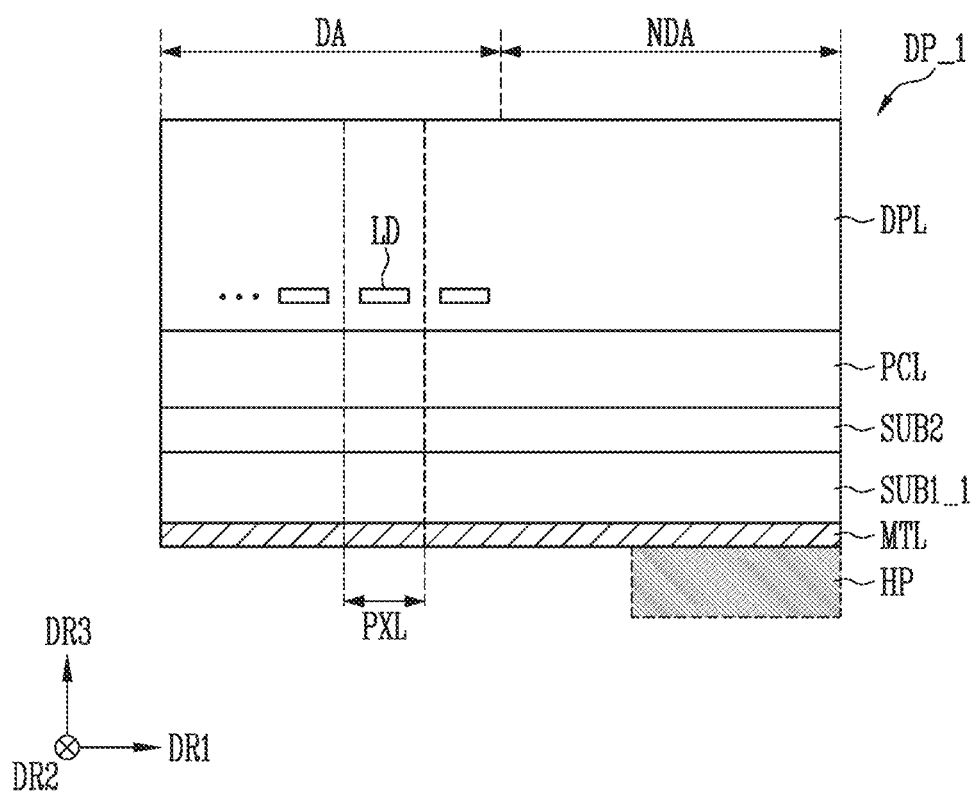
FIG. 15 is a sectional view illustrating an embodiment of a display panel included in the display module shown in FIG. 14.

FIG. 14 is a sectional view illustrating another embodiment of the display module included in the display device shown in FIGS. 6A and 6B. FIG. 15 is a sectional view illustrating an embodiment of a display panel included in the display module shown in FIG. 14.

First, referring to FIGS. 6A, 6B, 14, and 15, a display module DM_1 may include a display panel DP_1, an upper film UF (e.g., a first film), a lower film LF (e.g., a second film), and a heat pipe HP. Except for a heat conductive layer MTL, the display panel DP_1, the upper film UF, the lower film LF, and the heat pipe HP shown in FIG. 14 may be the same or substantially the same as (or similar to) the display panel DP, the upper film UF, the lower film LF, and the heat pipe HP described above with reference to FIG. 6A. In addition, except for the position at which the heat conductive layer MTL is disposed, the display panel DP_1 shown in FIG. 14 may be the same or substantially the same as (or similar to) the display panel DP described above with reference to FIGS. 8A and 8B. Therefore, redundant description may not be repeated.

The heat conductive layer MTL may be disposed between the display panel DP_1 and the lower film LF. The heat conductive layer MTL may be included in the display panel DP_1, but the present disclosure is not limited thereto. As described above, the heat conductive layer MTL may transfer heat generated in the display panel DP_1 toward the heat pipe HP. The heat conductive layer MTL may be electrically separated (e.g., electrically insulated) from the display panel DP_1 (or from a pixel circuit included in the display panel DP_1).

As shown in FIG. 15, the heat conductive layer MTL may be disposed on the bottom (e.g., the rear) of a first substrate SUB1_1. The first substrate SUB1_1 may not include the opening OP shown in FIG. 8A, but the present disclosure is not limited thereto.

The heat conductive layer MTL may be entirely disposed on the bottom of (e.g., the rear of) the display panel DP_1 to cover a lower surface (e.g., a rear surface) of the display panel DP_1, or may be disposed on a portion of the display panel DP_1. As described above with reference to FIG. 8A, the heat conductive layer MTL may be disposed at (e.g., in or on) the non-display area NDA and the display area DA. As another example, as described above with reference to FIG. 8B, the heat conductive layer MTL may be disposed at (e.g., in or on) the non-display area NDA (e.g., only the non-display area).

The heat pipe HP may be disposed on the bottom of the heat conductive layer MTL exposed by the lower film LF. A lower surface of the heat conductive layer MTL may be exposed at an end portion of the lower film LF in the first direction DR1, and the heat pipe HP may be disposed at (e.g., in or on) an end area of the heat conductive layer MTL that does not overlap with the lower film LF on a plane (e.g., in a plan view). As described above with reference to FIGS. 4, 5A, and 5B, an area at (e.g., in or on) which the heat pipe HP is disposed may be the non-rolling area NRA.

As described above, the heat conductive layer MTL may be disposed between the display panel DP_1 and the lower film LF.

According to one or more embodiments of the present disclosure, in the display device, heat generated inside the display panel may be more effectively transferred and/or diffused through a metal layer disposed more adjacent to the internal circuit components between first and second base layers of the display panel. Also, the heat may be released to the outside through a heat pipe disposed at one end portion (e.g., the non-rolling area) of the display panel, and coupled to (e.g., connected to or attached to) the metal layer. Thus, deterioration of display quality caused by heat generation of the display device or the display panel may be reduced or minimized.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
 a display panel configured to be rolled and unrolled;
 a housing configured to accommodate the display panel therein when the display panel is in a rolled state, the housing having a slot at one side surface thereof;
 a rotating member located inside the housing, the rotating member configured to roll and unroll the display panel;
 a holding member configured to hold the rotating member; and
 a heat pipe located at a partial area of the display panel that is adjacent to the slot of the housing when the display panel is in the rolled state,
 wherein the display panel comprises:
 a first base layer;
 a second base layer on the first base layer;
 a pixel circuit layer on the second base layer, the pixel circuit layer comprising a transistor;
 a display element layer on the pixel circuit layer, the display element layer comprising a light emitting element electrically connected to the transistor; and
 a metal layer between the first base layer and the second base layer,
 wherein the heat pipe is in contact with the metal layer,
 wherein an opening exposing the metal layer penetrates the first base layer, and the heat pipe is located in the opening,
 wherein at least a portion of each of the first base layer and the second base layer is configured to be rollable at one side thereof, and
 wherein the heat pipe is located at one area of the second base layer adjacent to another side of the first base layer opposite to the one side of the first base layer, and is configured to not be rollable.

2. The display device of claim 1, wherein the metal layer is electrically insulated from the transistor of the pixel circuit layer.

3. The display device of claim 2, wherein the metal layer does not overlap with the light emitting element in a plan view when the display panel is in an unrolled state.

4. The display device of claim 2, further comprising a lower film under the first base layer, wherein the heat pipe does not overlap with the lower film in a plan view.

5. The display device of claim 2, wherein the light emitting element comprises an inorganic light emitting diode.

6. The display device of claim 2, wherein the display element layer further comprises a light conversion pattern over the light emitting element, the light conversion pattern being configured to convert a wavelength of light emitted from the light emitting element.

7. The display device of claim 1, wherein the metal layer does not overlap with the light emitting element in a plan view when the display panel is in an unrolled state.

8. The display device of claim 7, further comprising a lower film under the first base layer,
wherein the heat pipe does not overlap with the lower film in a plan view.

9. The display device of claim 7, wherein the light emitting element comprises an inorganic light emitting diode.

10. The display device of claim 7, wherein the display element layer further comprises a light conversion pattern over the light emitting element, the light conversion pattern being configured to convert a wavelength of light emitted from the light emitting element.

11. The display device of claim 1, further comprising a lower film under the first base layer,
wherein the heat pipe does not overlap with the lower film in a plan view.

12. The display device of claim 11, wherein the lower film comprises a first cushion layer, a support layer, and a second cushion layer, which are sequentially stacked, and
wherein the support layer comprises a support member having an area of an upper surface facing the first cushion layer and an area of a lower surface facing the second cushion layer that are different from each other.

13. The display device of claim 12, wherein the support member comprises a plurality of support patterns spaced from each other along a rolling direction of the first base layer.

14. The display device of claim 13, wherein the display element layer further comprises a light conversion pattern over the light emitting element, the light conversion pattern being configured to convert a wavelength of light emitted from the light emitting element.

15. The display device of claim 12, wherein the display element layer further comprises a light conversion pattern over the light emitting element, the light conversion pattern being configured to convert a wavelength of light emitted from the light emitting element.

16. The display device of claim 11, wherein the display element layer further comprises a light conversion pattern over the light emitting element, the light conversion pattern being configured to convert a wavelength of light emitted from the light emitting element.

17. The display device of claim 1, wherein the light emitting element comprises an inorganic light emitting diode.

18. The display device of claim 17, wherein the display element layer further comprises a light conversion pattern over the light emitting element, the light conversion pattern being configured to convert a wavelength of light emitted from the light emitting element.

19. The display device of claim 1, wherein the display element layer further comprises a light conversion pattern over the light emitting element, the light conversion pattern being configured to convert a wavelength of light emitted from the light emitting element.

* * * * *